(12) United States Patent
Inagaki et al.

(10) Patent No.: US 10,622,074 B2
(45) Date of Patent: Apr. 14, 2020

(54) SEMICONDUCTOR STORAGE DEVICE

(71) Applicant: TOSHIBA MEMORY CORPORATION, Minato-ku, Tokyo (JP)

(72) Inventors: Maya Inagaki, Yokohama Kanagawa (JP); Masaru Koyanagi, Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 359 days.

(21) Appl. No.: 15/700,892

(22) Filed: Sep. 11, 2017

(65) Prior Publication Data

US 2018/0233205 A1    Aug. 16, 2018

(30) Foreign Application Priority Data

Feb. 16, 2017  (JP) .................. 2017-027350

(51) Int. Cl.
*G11C 16/22* (2006.01)
*H02H 9/04* (2006.01)
(Continued)

(52) U.S. Cl.
CPC .......... *G11C 16/22* (2013.01); *G11C 16/0483* (2013.01); *G11C 16/30* (2013.01);
(Continued)

(58) Field of Classification Search
CPC ..... G11C 16/0483; G11C 16/10; G11C 16/22; G11C 16/26; G11C 16/30; H01L 23/60; H01L 24/05; H01L 24/13; H01L 24/16; H01L 24/17; H01L 24/32; H01L 24/48; H01L 24/73; H01L 25/0657; H01L 25/18; H01L 27/0266; H01L 27/0285; H01L 27/0288; H01L 2224/04042; H01L 2224/05548; H01L 2224/0557; H01L 2224/13025; H01L 2224/16145;
(Continued)

(56) References Cited

U.S. PATENT DOCUMENTS 6,239,495 B1   5/2001  Sakui et al.
6,690,561 B2 * 2/2004  Hung ................ H02H 9/046
                                                361/111
(Continued)

FOREIGN PATENT DOCUMENTS

JP   2000049277 A    2/2000
JP   2010103274 A    5/2010
(Continued)

*Primary Examiner* — Kevin J Comber
(74) *Attorney, Agent, or Firm* — Holtz, Holtz & Volek PC

(57) ABSTRACT

According to an embodiment, a semiconductor storage device includes a first chip including a power supply protection circuit. The power supply protection circuit including: a resistor including a first end connected to the second pad; a first capacitor including a first end connected to a second end of the resistor; a first transistor including a first end connected to the second pad, a second end connected to a node with a signal of a value based on a voltage of the first end of the first capacitor, and a gate connected to the first pad; a first inverter including an input terminal connected to the second end of the first transistor; and a second transistor including a gate connected to an output terminal of the first inverter.

17 Claims, 25 Drawing Sheets

(51) Int. Cl.
*H01L 25/065* (2006.01)
*H01L 27/02* (2006.01)
*G11C 16/30* (2006.01)
*H01L 23/60* (2006.01)
*H01L 25/18* (2006.01)
*G11C 16/04* (2006.01)
*G11C 16/10* (2006.01)
*G11C 16/26* (2006.01)
*H01L 23/00* (2006.01)

(52) U.S. Cl.
CPC .......... *H01L 23/60* (2013.01); *H01L 25/0657* (2013.01); *H01L 25/18* (2013.01); *H01L 27/0266* (2013.01); *H01L 27/0285* (2013.01); *H01L 27/0288* (2013.01); *H02H 9/046* (2013.01); *G11C 16/10* (2013.01); *G11C 16/26* (2013.01); *H01L 24/05* (2013.01); *H01L 24/13* (2013.01); *H01L 24/16* (2013.01); *H01L 24/17* (2013.01); *H01L 24/32* (2013.01); *H01L 24/48* (2013.01); *H01L 24/73* (2013.01); *H01L 2224/04042* (2013.01); *H01L 2224/0557* (2013.01); *H01L 2224/05548* (2013.01); *H01L 2224/13025* (2013.01); *H01L 2224/16145* (2013.01); *H01L 2224/16146* (2013.01); *H01L 2224/16227* (2013.01); *H01L 2224/1703* (2013.01); *H01L 2224/17181* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73253* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06562* (2013.01); *H01L 2225/06586* (2013.01); *H01L 2924/15311* (2013.01)

(58) Field of Classification Search
CPC . H01L 2224/06146; H01L 2224/16227; H01L 2224/1703; H01L 2224/17181; H01L 2224/32145; H01L 2224/32225; H01L 2224/48091; H01L 2224/48227; H01L 2224/73253; H01L 2224/73265; H01L 2224/48145; H01L 2225/0651; H01L 2225/06562; H01L 2225/06586; H01L 2225/06506; H01L 2225/06513; H01L 2225/06517; H01L 2225/06541; H01L 2924/15311; H01L 2924/00012; H01L 2924/00014; H01L 2924/00; H02H 9/046
USPC ......................................................... 361/56
See application file for complete search history.

(56) References Cited

U.S. PATENT DOCUMENTS 8,169,761 B2 * 5/2012 Yeh ...................... H01L 27/0266
361/111
8,547,670 B2 * 10/2013 Shimomura ........ H01L 27/0285
361/56
2010/0103573 A1 4/2010 Sasaki
2014/0029144 A1 1/2014 Kaku
2014/0098448 A1 4/2014 Henderson et al.

FOREIGN PATENT DOCUMENTS

JP 2014026996 A 2/2014
JP 2015103689 A 6/2015
JP 2015532534 A 11/2015

* cited by examiner

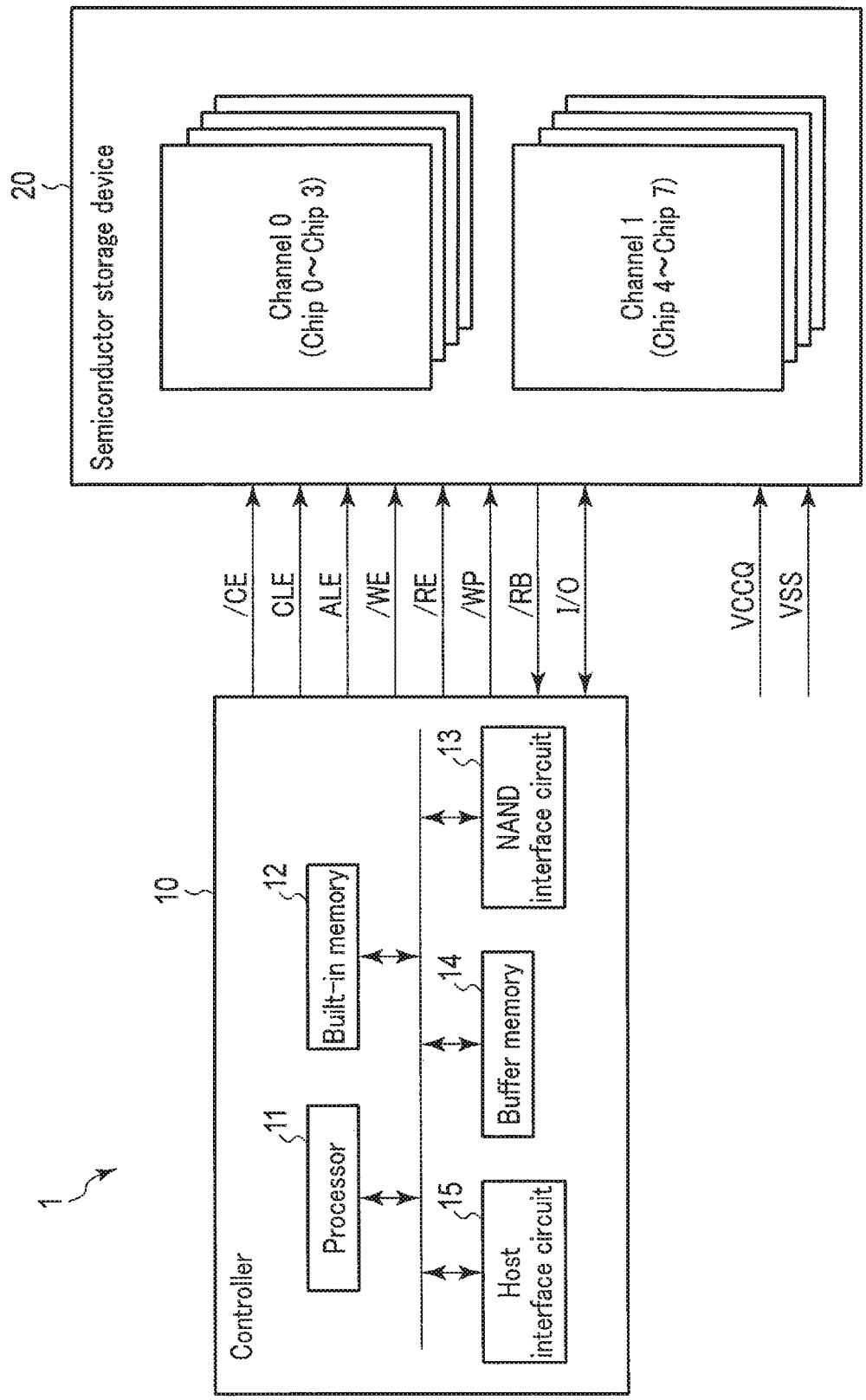
F I G. 1

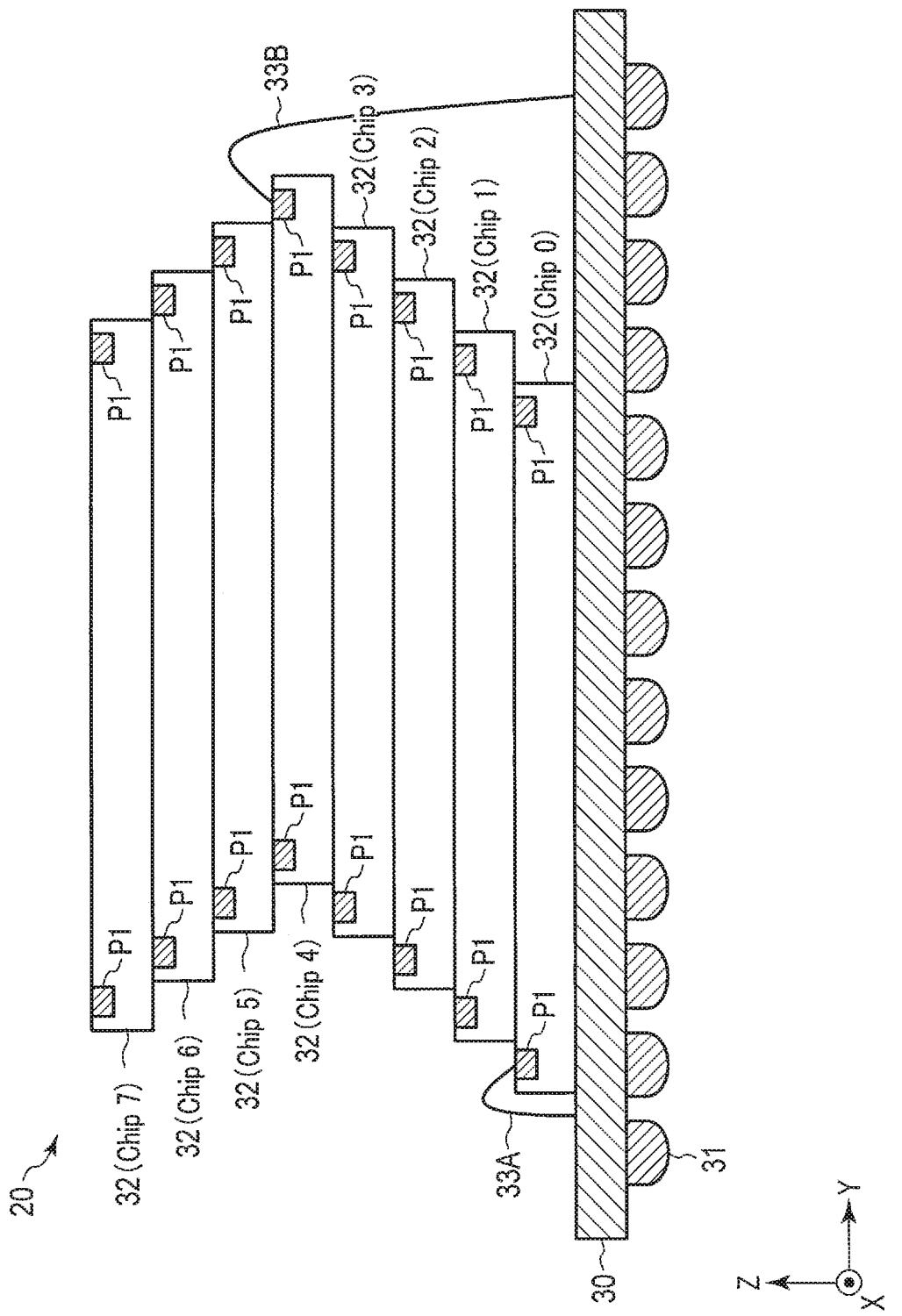
F I G. 3

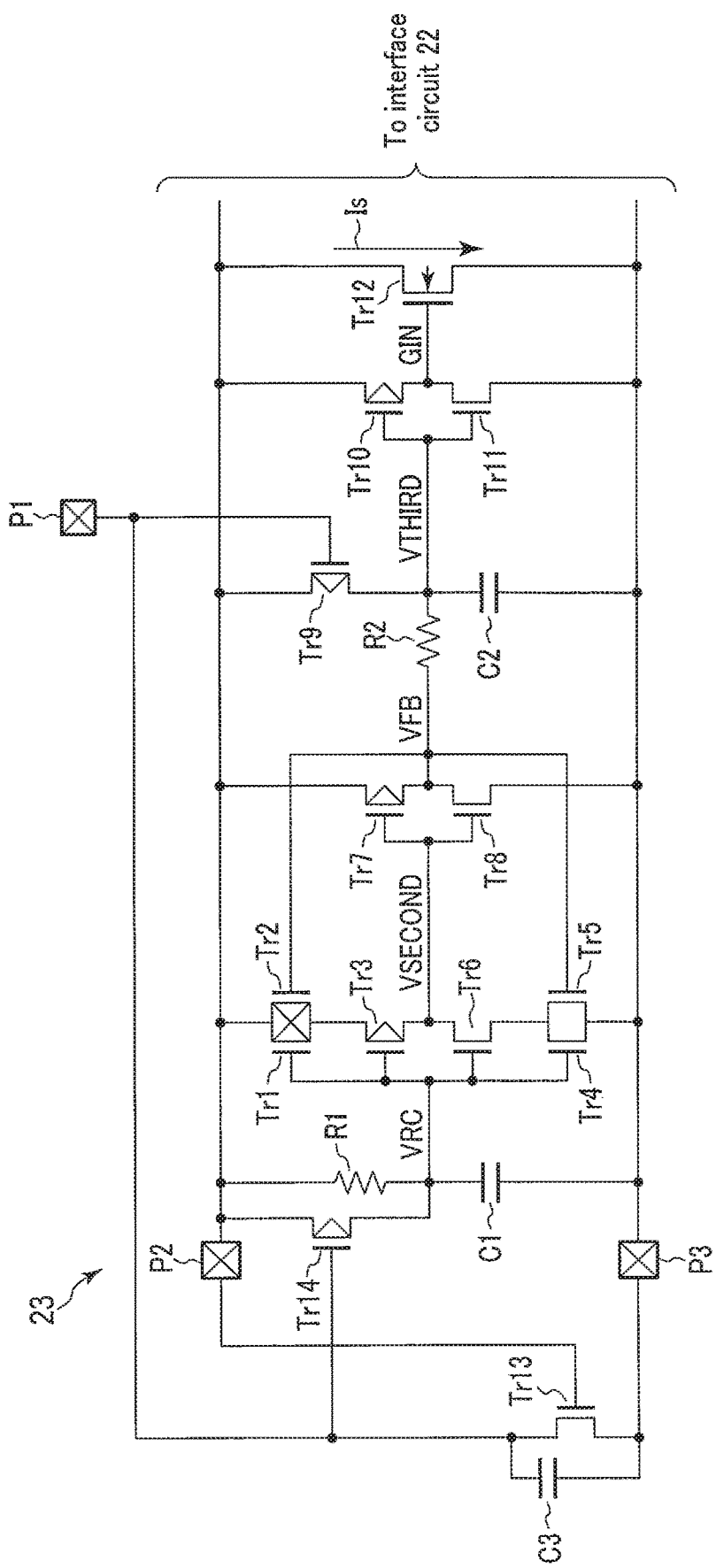
F I G. 8

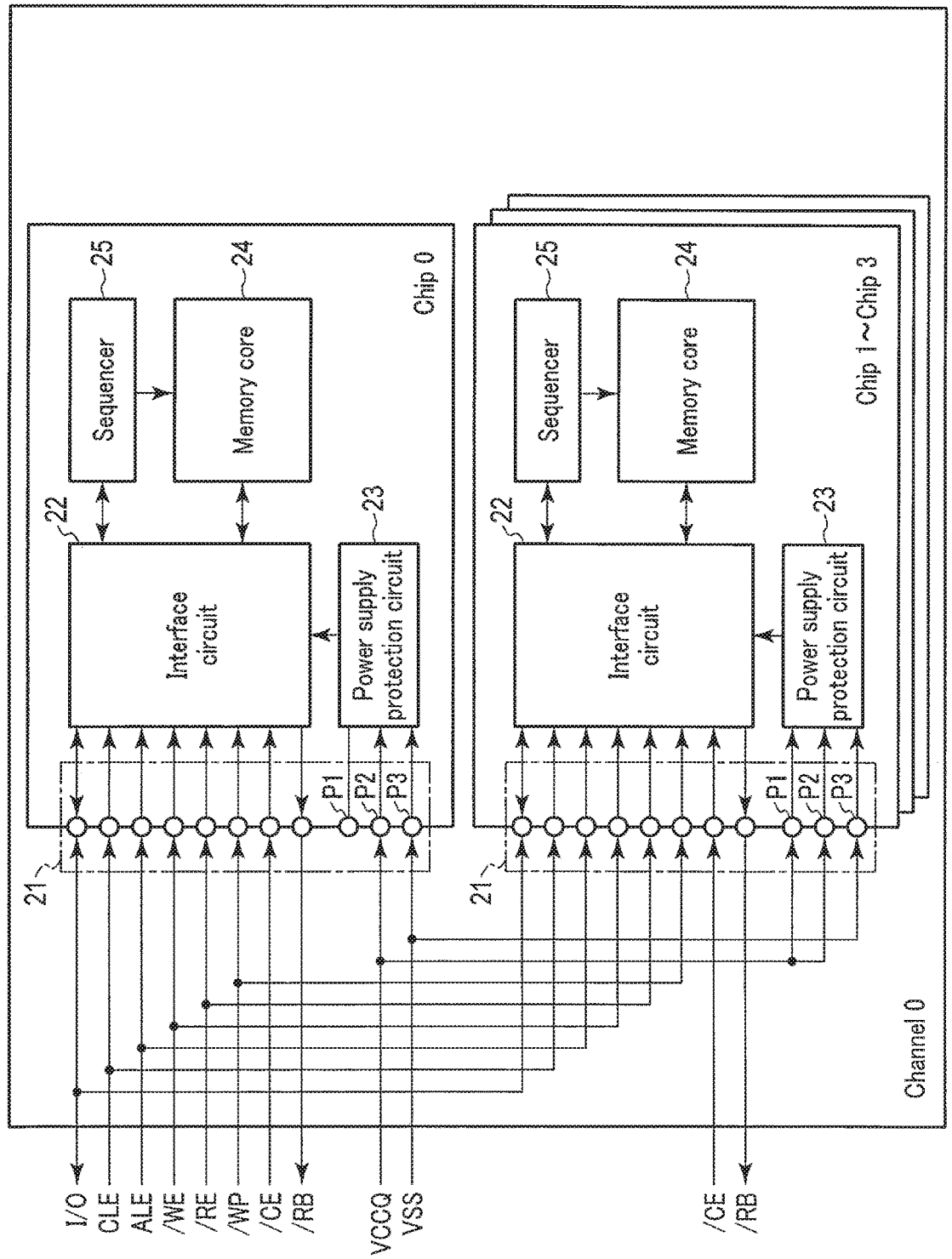
F I G. 9

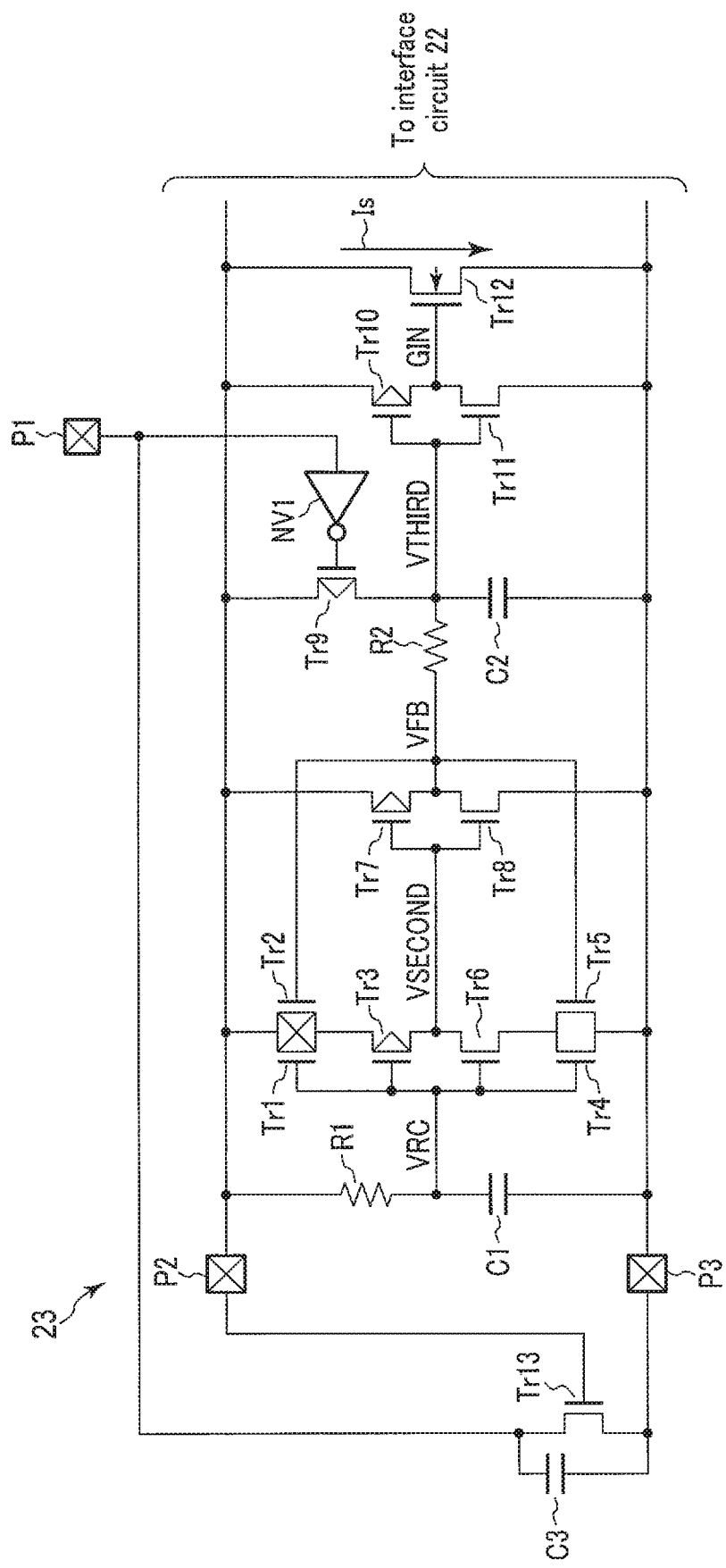
F I G. 11

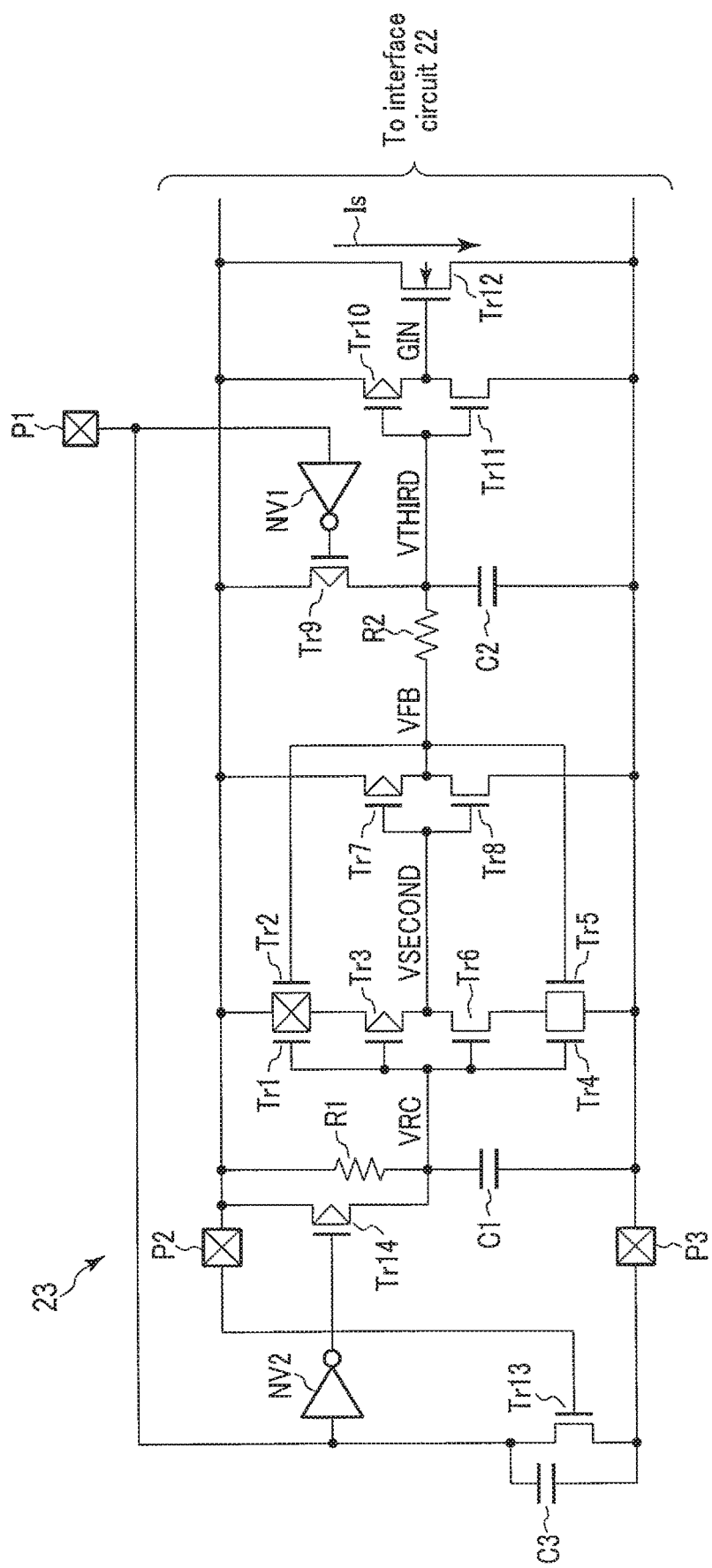
F I G. 14

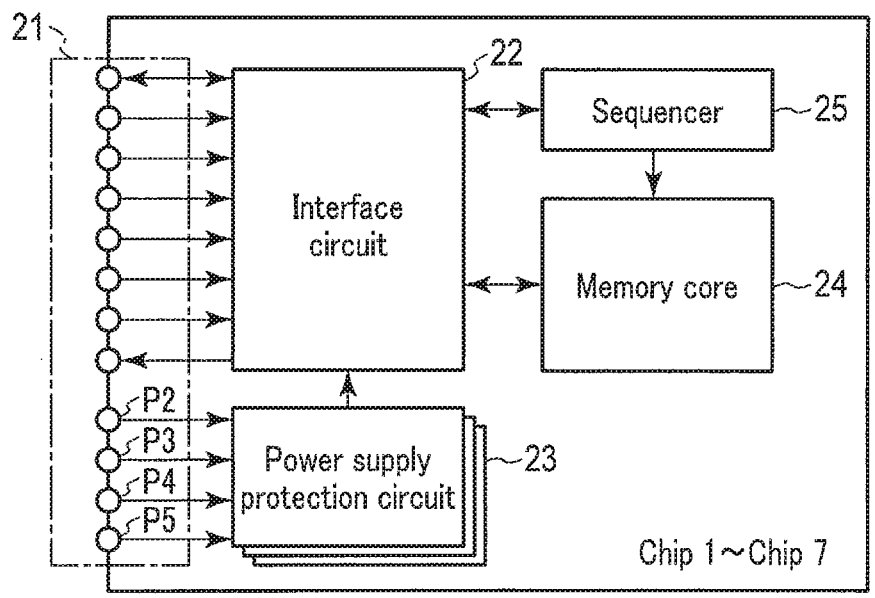
F I G. 15

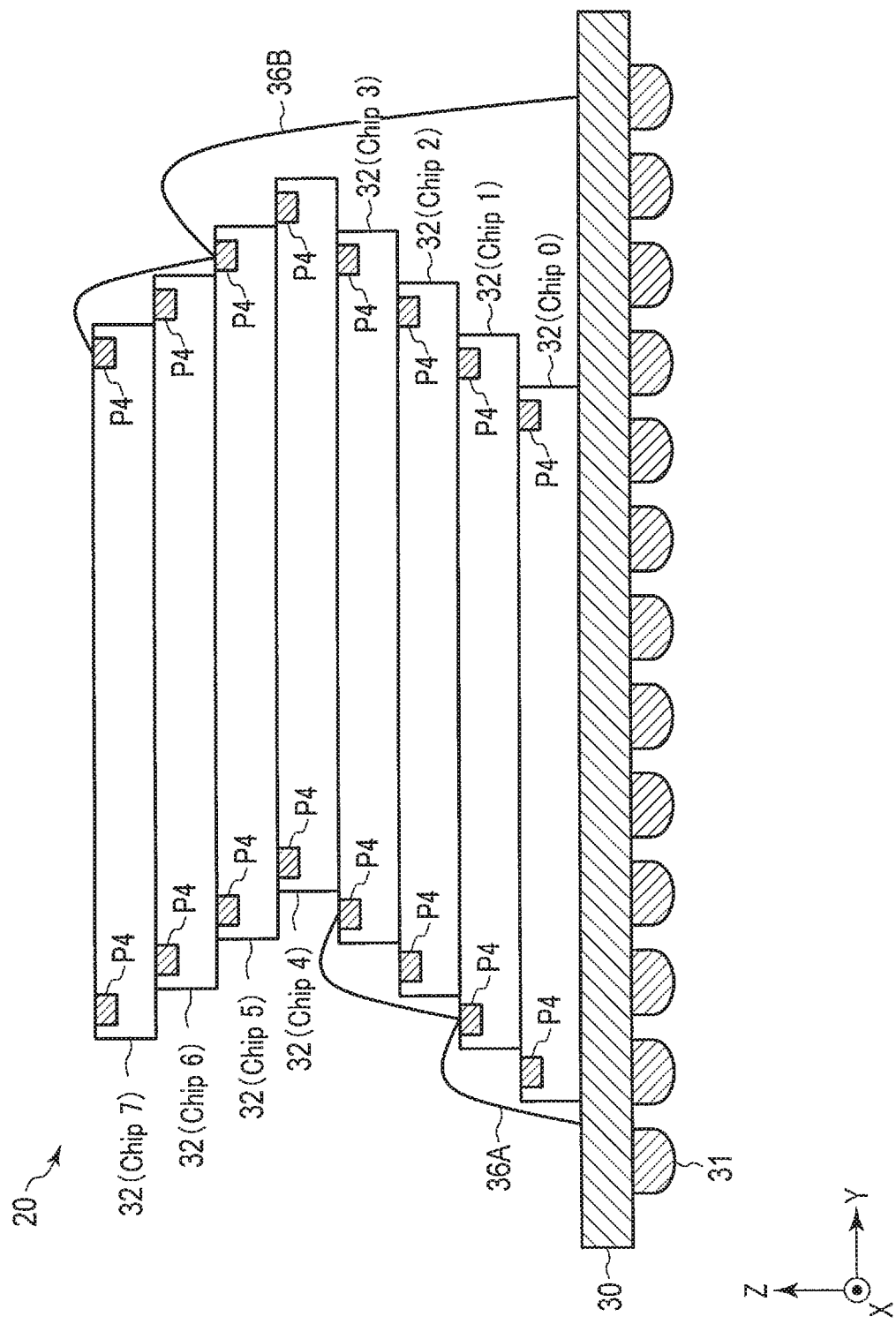
F I G. 16

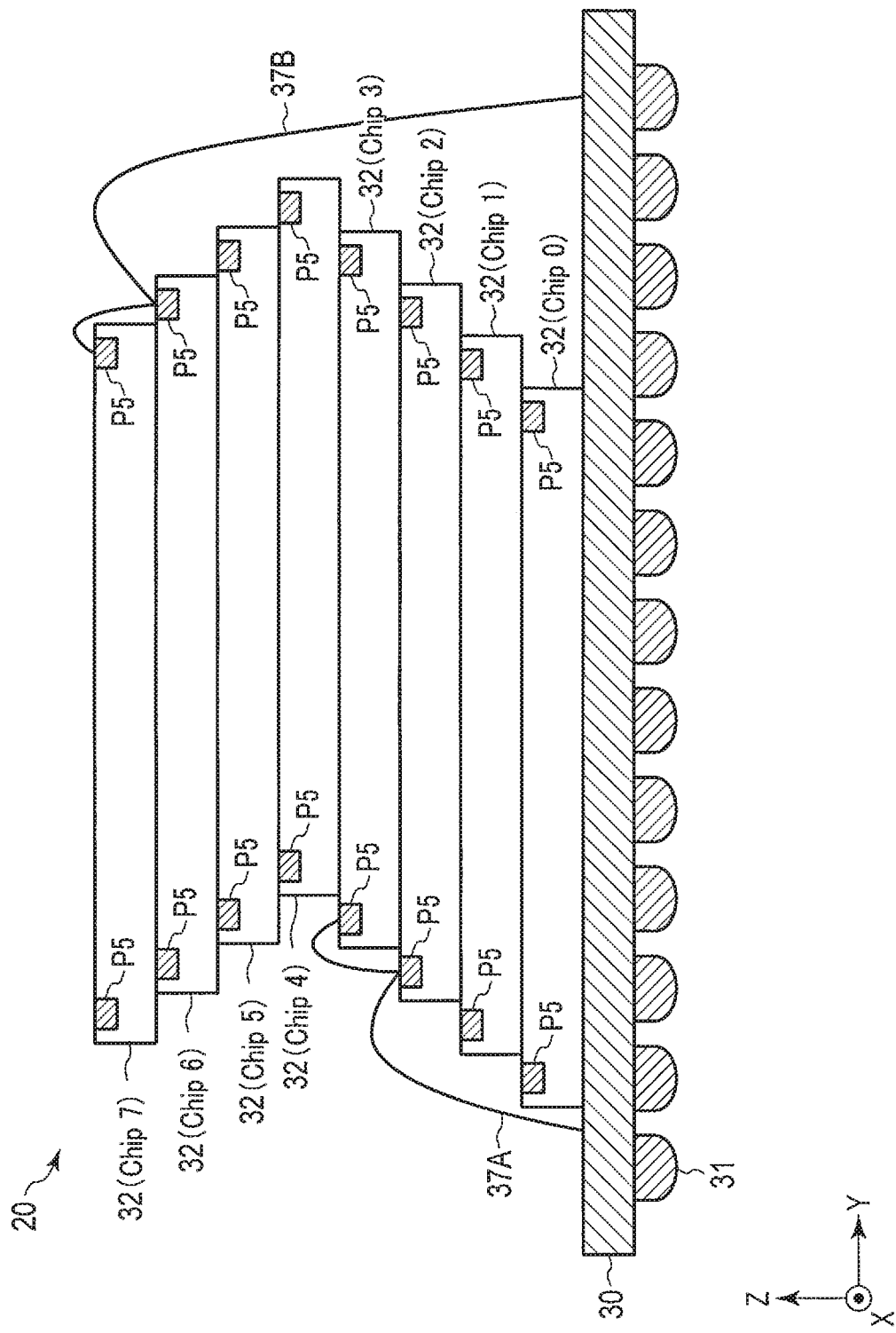
F I G. 17

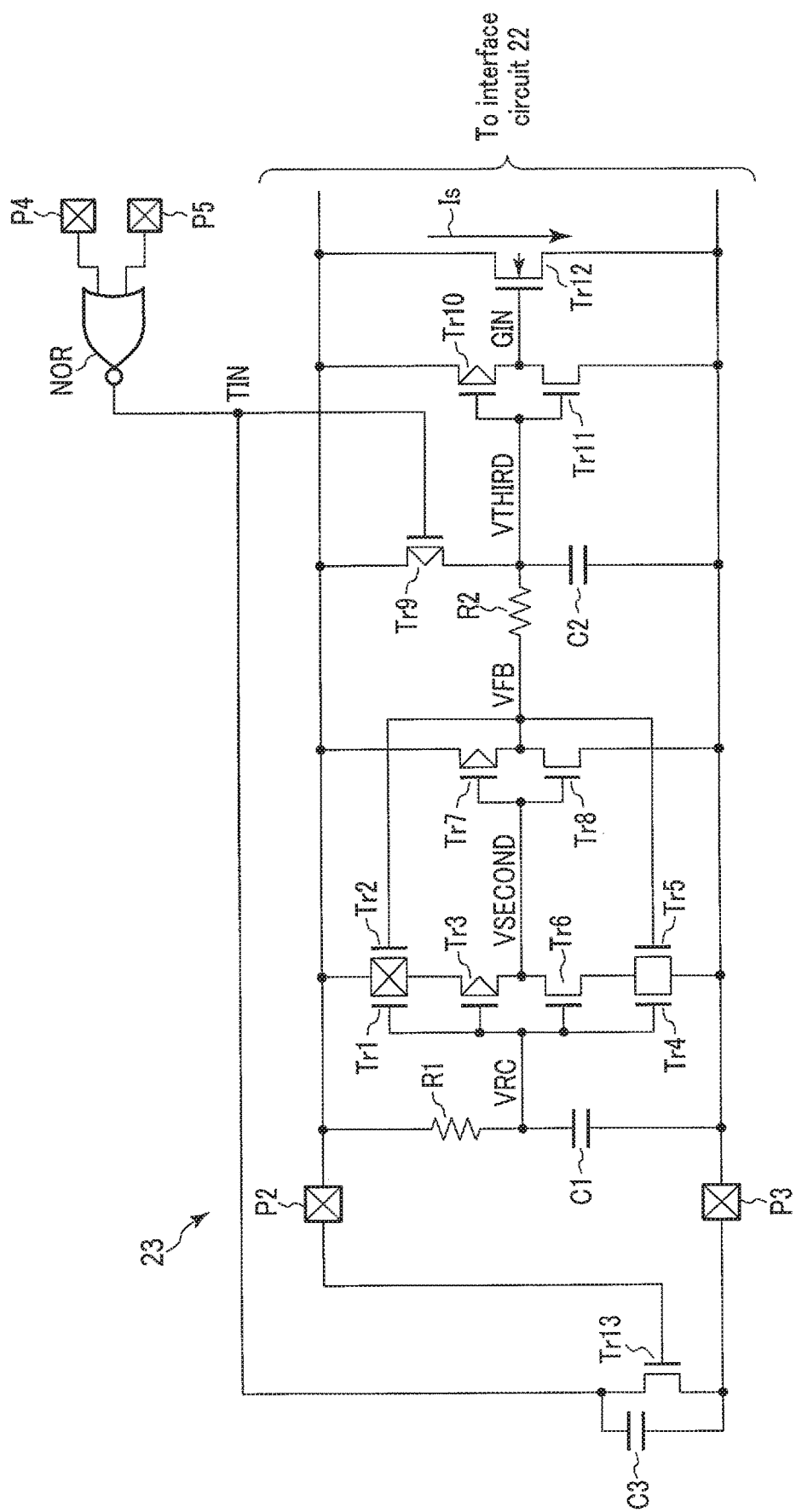
F I G. 18

|  | P4 | P5 | TIN |
|---|---|---|---|
| Chip 0,Chip 4 | VSS | VSS | VCCQ |
| Chip 1,Chip 5 | VCCQ | VSS | VSS |
| Chip 2,Chip 6 | VSS | VCCQ | VSS |
| Chip 3,Chip 7 | VCCQ | VCCQ | VSS |

FIG. 19

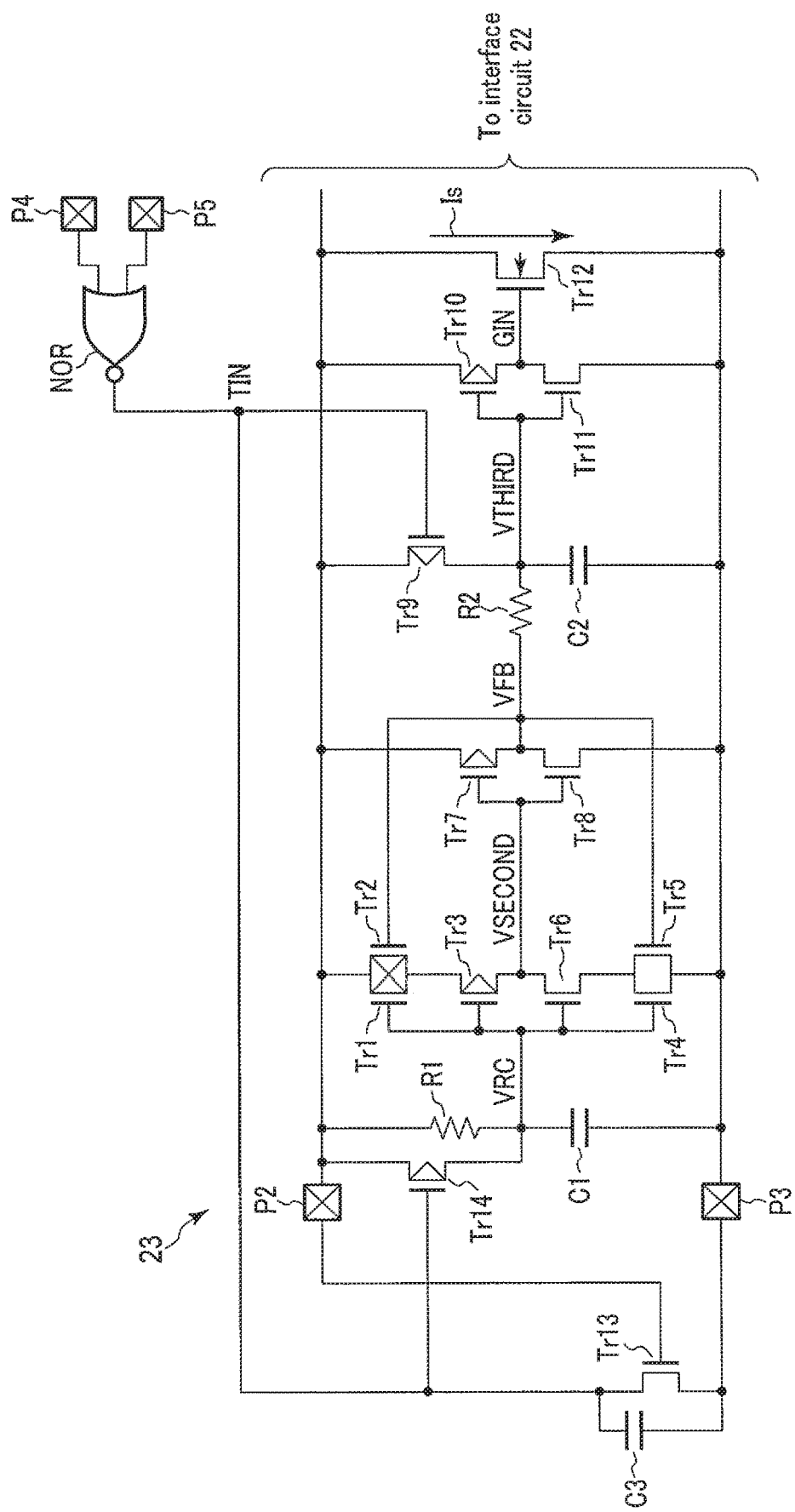
F I G. 22

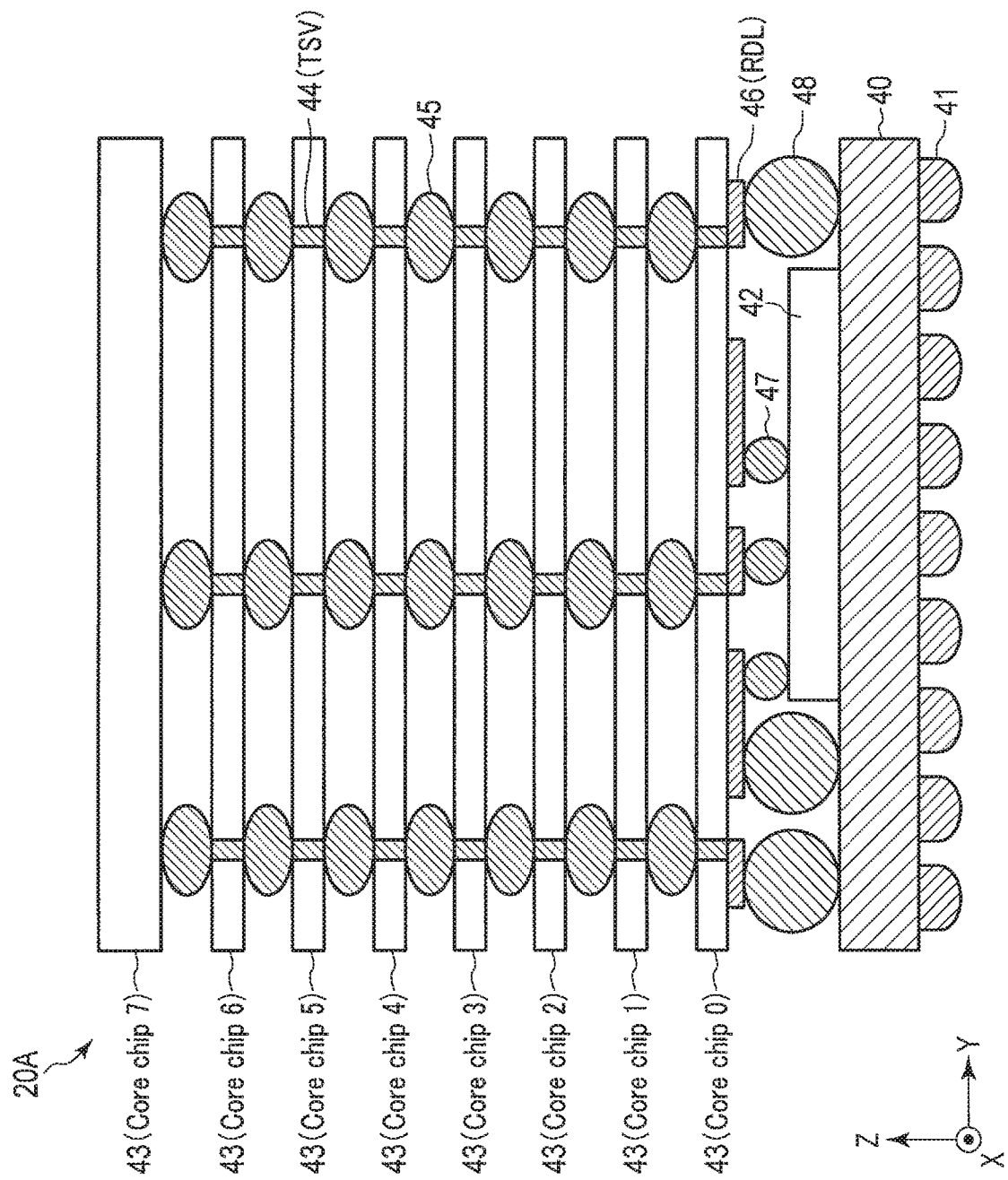
F I G. 23

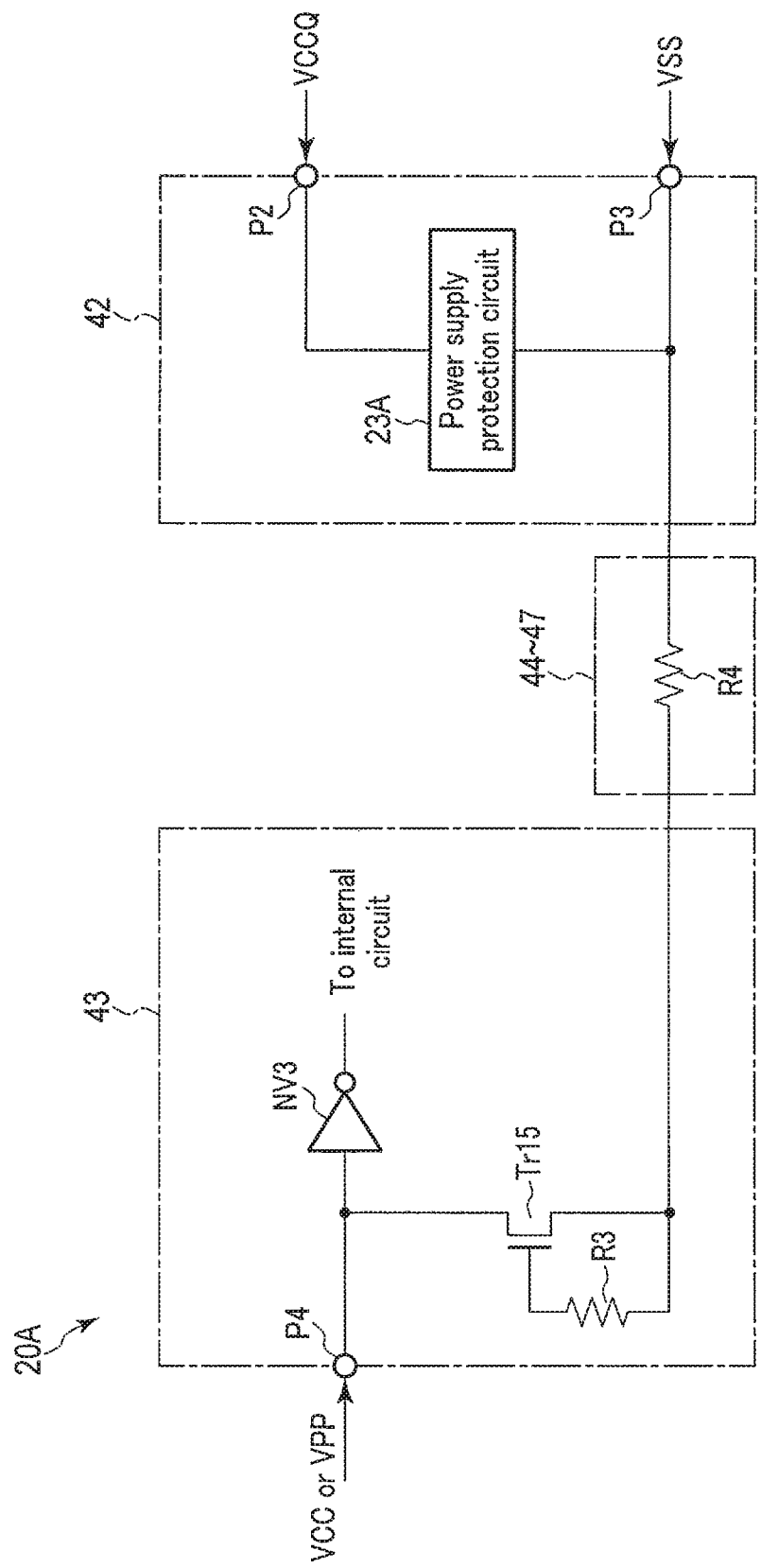
F I G. 24

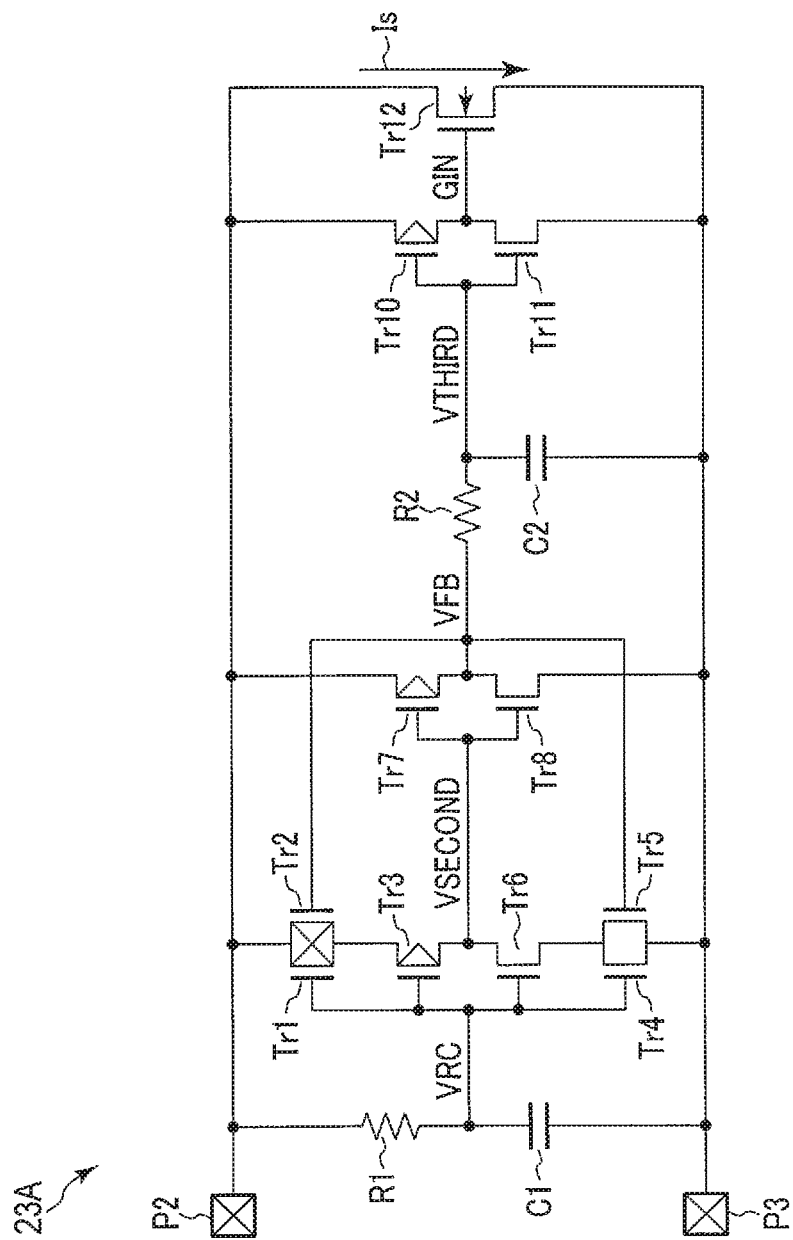
F I G. 25

SEMICONDUCTOR STORAGE DEVICE

CROSS-REFERENCE TO RELATED APPLICATIONS

This application is based upon and claims the benefit of priority from Japanese Patent Application No. 2017-027350, filed Feb. 16, 2017, the entire contents of which are incorporated herein by reference.

FIELD

Embodiments described herein relate generally to a semiconductor storage device.

BACKGROUND

A NAND flash memory as a semiconductor storage device is known.

BRIEF DESCRIPTION OF THE DRAWINGS

FIG. 1 is a block diagram for describing the configuration of a memory system according to a first embodiment.

FIG. 3 is a cross-sectional view for describing the configuration of the semiconductor storage device according to the first embodiment.

FIG. 8 is a circuit diagram for describing the configuration of a power supply protection circuit of a semiconductor storage device according to a modification of the first embodiment.

FIG. 9 is a block diagram for describing the configuration of a semiconductor storage device according to a second embodiment.

FIG. 11 is a circuit diagram for describing the configuration of a power supply protection circuit of the semiconductor storage device according to the second embodiment.

FIG. 14 is a circuit diagram for describing the configuration of a power supply protection circuit of a semiconductor storage device according to a modification of the second embodiment.

FIG. 15 is a block diagram for describing the configuration of a semiconductor storage device according to a third embodiment.

FIG. 16 is a cross-sectional view for describing the configuration of the semiconductor storage device according to the third embodiment.

FIG. 17 is a cross-sectional view for describing the configuration of the semiconductor storage device according to the third embodiment.

FIG. 18 is a circuit diagram for describing the configuration of a power supply protection circuit of the semiconductor storage device according to the third embodiment.

FIG. 19 is a table for describing voltages which are supplied to the power supply protection circuit of the semiconductor storage device according to the third embodiment.

FIG. 22 is a circuit diagram for describing the configuration of a power supply protection circuit of a semiconductor storage device according to a modification of the third embodiment.

FIG. 23 is a cross-sectional view for describing the configuration of a semiconductor storage device according to a fourth embodiment.

FIG. 24 is a circuit diagram for describing the configuration of the semiconductor storage device according to the fourth embodiment.

FIG. 25 is a circuit diagram for describing the configuration of a power supply protection circuit of the semiconductor storage device according to the fourth embodiment.

DETAILED DESCRIPTION

Figure 2:
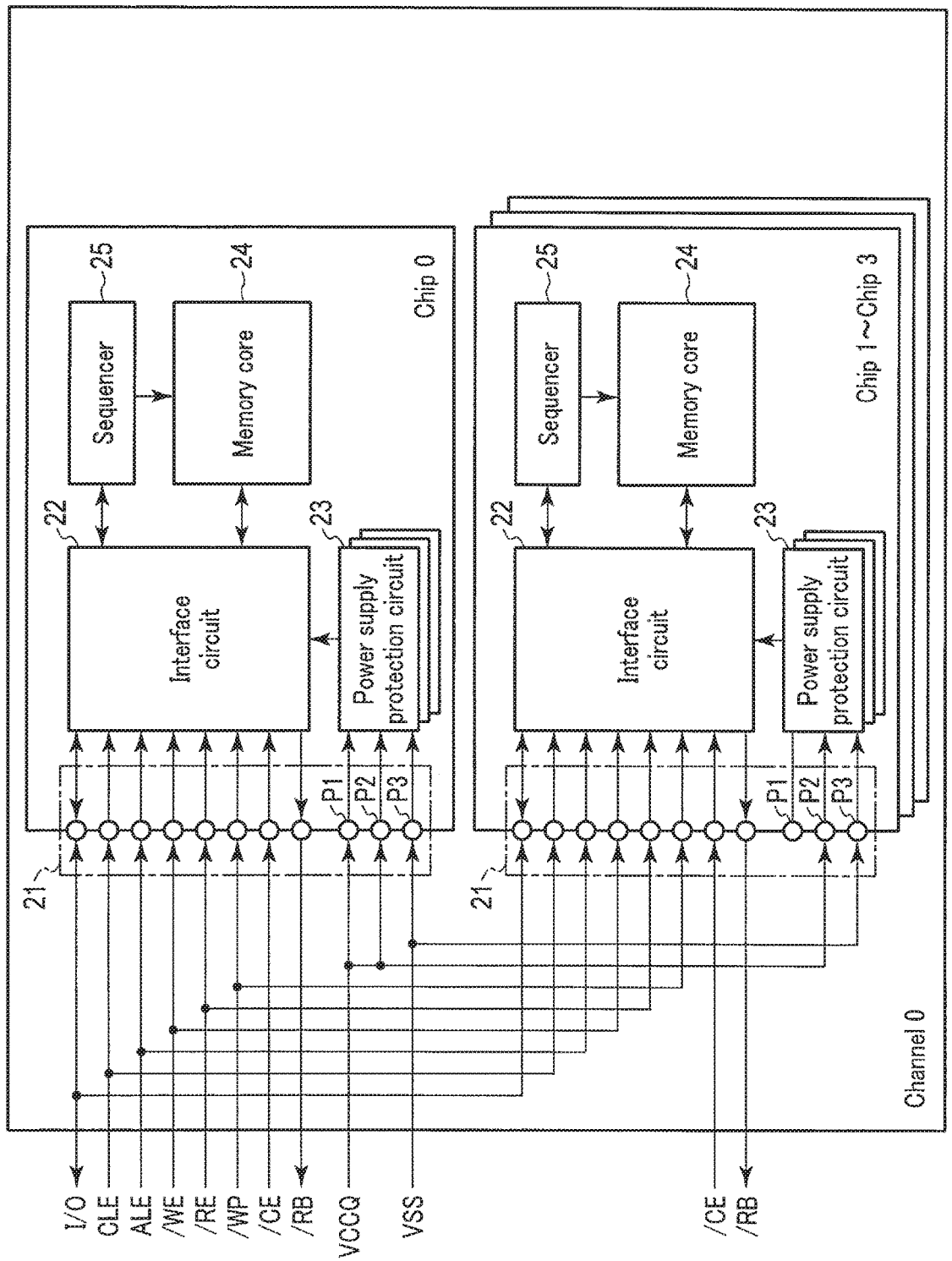
FIG. 2 is a block diagram for describing the configuration of a semiconductor storage device according to the first embodiment.

In general, according to one embodiment, a semiconductor storage device includes a first chip including a power supply protection circuit, the power supply protection circuit including: a first pad; a second pad to which a first voltage is supplied; a third pad to which a second voltage lower than the first voltage is supplied; a resistor including a first end electrically connected to the second pad; a first capacitor including a first end electrically connected to a second end of the resistor; a first transistor including a first end electrically connected to the second pad, a second end electrically connected to a node with a signal of a value based on a voltage of the first end of the first capacitor, and a gate electrically connected to the first pad; a first inverter including an input terminal electrically connected to the second end of the first transistor; and a second transistor electrically connected between the second pad and the third pad, the second transistor including a gate electrically connected to an output terminal of the first inverter.

Embodiments will be described below with reference to the accompanying drawings. Note that in the following description, common reference numerals denote components having the same functions and configurations.

1. First Embodiment

A semiconductor storage device according to a first embodiment will be described. The semiconductor storage device according to the first embodiment includes, for example, a NAND flash memory.

1.1 Re: Configuration

To begin with, the configuration of a memory system according to the first embodiment will be described.

1.1.1 Re: Overall Configuration of Memory System

A configuration example of the memory system according to the first embodiment will be described with reference to FIG. 1. FIG. 1 is a block diagram illustrating an example of the configuration of the memory system according to the first embodiment. A memory system 1 communicates with, for example, an external host device (not shown). The memory system 1 stores data from the host device, and reads out data to the host device.

As illustrated in FIG. 1, the memory system 1 includes a controller 10 and a semiconductor storage device 20. The controller 10 receives an instruction from the host device, and controls the semiconductor storage device 20, based on the received instruction. Specifically, the controller 10 writes data, the write of which was instructed from the host device, to the semiconductor storage device 20, and the controller 10 reads out data, the read of which was instructed from the host device, from the semiconductor storage device 20, and transmits the read-out data to the host device. The controller 10 is connected to the semiconductor storage device 20 by a NAND bus. The semiconductor storage device 20 includes, for example, two channels (channel 0 and channel 1). Each of channel 0 and channel 1 includes, for example, four chips (chip 0, chip 1, chip 2, and chip 3; chip 4, chip 5, chip 6, and chip 7). Each of the chip 0 to chip 7 includes a plurality of memory cells, and functions as a NAND flash memory by storing data, for example, nonvolatilely. However, the memory cells are not limited to this, and may store data volatilely. The number of channels in the semiconductor storage device 20, and the number of chips in the channel are not limited to the above example, and the number may be adopted on a discretionary basis.

The NAND bus executes transmission and reception of signals /CE, CLE, ALE, /WE, /RE, /WP, /RB, and I/O, along with a NAND interface. The signal /CE is a signal for enabling the semiconductor storage device 20. The signal CLE notifies the semiconductor storage device 20 that the signal I/O, which flows to the semiconductor storage device 20 while the signal CLE is at an "H (High)" level, is a command. The signal ALE notifies the semiconductor storage device 20 that the signal I/O, which flows to the semiconductor storage device 20 while the signal ALE is at the "H" level, is an address. The signal /WE instructs the semiconductor storage device 20 to take in the I/O signal which flows to the semiconductor storage device 20 while the signal /WE is at an "L (Low)" level. The signal /RE instructs the semiconductor storage device 20 to output the signal I/O. The signal /WP instructs the semiconductor storage device 20 to prohibit data write and data erase. The /RB signal indicates whether the semiconductor storage device 20 is in a ready state (a state in which an instruction from the outside is acceptable) or in a busy state (a state in which an instruction from the outside is not acceptable). The signal I/O is, for example, an 8-bit signal. The signal I/O is a substance of data which is transmitted/received between the semiconductor storage device 20 and controller 10, and includes a command, an address, and data. The data includes, for example, write data and read data.

In addition, various electric power sources are supplied to the semiconductor storage device 20. Voltages, which are supplied to the semiconductor storage device 20, include, for example, voltages VCCQ and VSS. The voltage VCCQ is a voltage which is supplied to a power supply protection circuit (not shown) and an interface circuit (not shown) in the semiconductor storage device 20, and is, for example, 1.2 V. The voltage VSS is a ground voltage and is lower than the voltage VCCQ. The voltage VSS is, for example, 0 V.

1.1.2 Re: Configuration of Controller

Next, also referring to FIG. 1, the controller of the memory system according to the first embodiment is described. The controller 10 includes a processor (CPU: Central Processing Unit) 11, a built-in memory (RAM: Random Access Memory) 12, a NAND interface circuit 13, a buffer memory 14, and a host interface circuit 15.

The processor 11 controls the entire operation of the controller 10. The processor 11, for example, issues a write instruction, which is based on the NAND interface, to the semiconductor storage device 20, in response to a data write instruction received from the host device. This operation similarly applies to the cases of read and erase.

The built-in memory 12 is, for example, a semiconductor memory such as a DRAM (Dynamic RAM), and is used as a working area of the processor 11. The built-in memory 12 stores firmware for managing the semiconductor storage device 20, various management tables, etc.

The NAND interface circuit 13 is connected to the semiconductor storage device 20 via the NAND bus, and manages the communication with the semiconductor storage device 20. In accordance with instructions of the processor 11, the NAND interface circuit 13 sends a command, an address, and write data to the semiconductor storage device 20. In addition, the NAND interface circuit 13 receives read data from the semiconductor storage device 20.

The buffer memory 14 temporarily stores data or the like, which is received from the semiconductor storage device 20 and the host device.

The host interface circuit 15 is connected to the host device, and manages the communication with the host device. The host interface circuit 15, for example, transfers an instruction and data, which are received from the host device, to the processor 11 and buffer memory 14, respectively.

1.1.3 Re: Configuration of Semiconductor Storage Device

Next, referring to FIG. 2, a configuration example of the semiconductor storage device according to the first embodiment will be described. FIG. 2 illustrates that part of the semiconductor storage device 20, which relates to the channel 0. Since channel 1 has the same configuration as channel 0, channel 0 will be described below, and a description of the configuration of channel 1, which overlaps the configuration of channel 0, will be omitted.

As described above, channel 0 includes a chip 0 to chip 3. Each of the chip 0 to chip 3 includes a pad group 21, an interface circuit 22, a plurality of power supply protection circuits 23, a memory core 24, and a sequencer 25. Since the chip 1 to chip 3 have the same configuration as the chip 0, a description of the parts overlapping with the chip 0 will be omitted.

The pad group 21 includes a plurality of pads for signal transmission/reception. The pad group 21 transfers the signals /CE, CLE, ALE, /WE, /RE, /WP, and I/O, which are received from the controller 10, to the interface circuit 22. In addition, the pad group 21 transfers the signal /RB, which is received from the interface circuit 22, to the outside of the semiconductor storage device 20. The signals /CE and /RB are input, for example, to corresponding pads via signal lines which are different between chips, and the other signals CLE, ALE, /WE, /RE, /WP and I/O are input, for example, to corresponding pads of each chip via signal lines which are common to the chips within the channel 0.

In addition, the pad group 21 includes a pad P1 for power supply circuit control, and pads P2 and P3 for voltage supply. The pads P1 and P2 share the voltage VCCQ with the power supply protection circuit 23, and the pad P3 shares the voltage VSS with the power supply protection circuit 23. The voltage VCCQ is supplied to only the pad P1 of the chip 0, and is not supplied to the pads P1 of the chip 1 to chip 3. In addition, the voltages VCCQ and VSS are supplied to the pads P2 and P3 of the respective chips via interconnects which are common to the chips within the chip 0. In the example of FIG. 2, although the pad P1 to pad P3 are illustrated as one functional block, they are not limited to this, and a plurality may be provided. When a plurality of pads P1 to P3 are provided in one chip, these pads P1 to P3 may be laid out in a distributed fashion at a plurality of locations within the chip.

The interface circuit 22 sends the command and address in the signal I/O to the sequencer 25, and transmits/receives data to/from the memory core 24.

When the plurality of pads P1 to P3 are provided, the respective power supply protection circuits 23 are provided in association with the layout within the chip of the plural pads P1 to P3. Each of the power supply protection circuits 23 shares the voltage VCCQ with the interface circuit 22. Each of the power supply protection circuits 23 has, for example, when a surge occurs in the voltage VCCQ, a function of sharing with the interface circuit 22 a voltage VCCQ in which the surge is reduced, based on the voltages VCCQ and VSS. The details of the power supply protection circuit 23 will be described later.

The memory core 24 includes a memory cell array (not shown) which stores data. The memory core 24 is configured to enable a data read process and a data write process for the memory cell array.

The sequencer 25 receives a command, and controls the entire chip in accordance with a sequence based on the received command.

Figure 4:
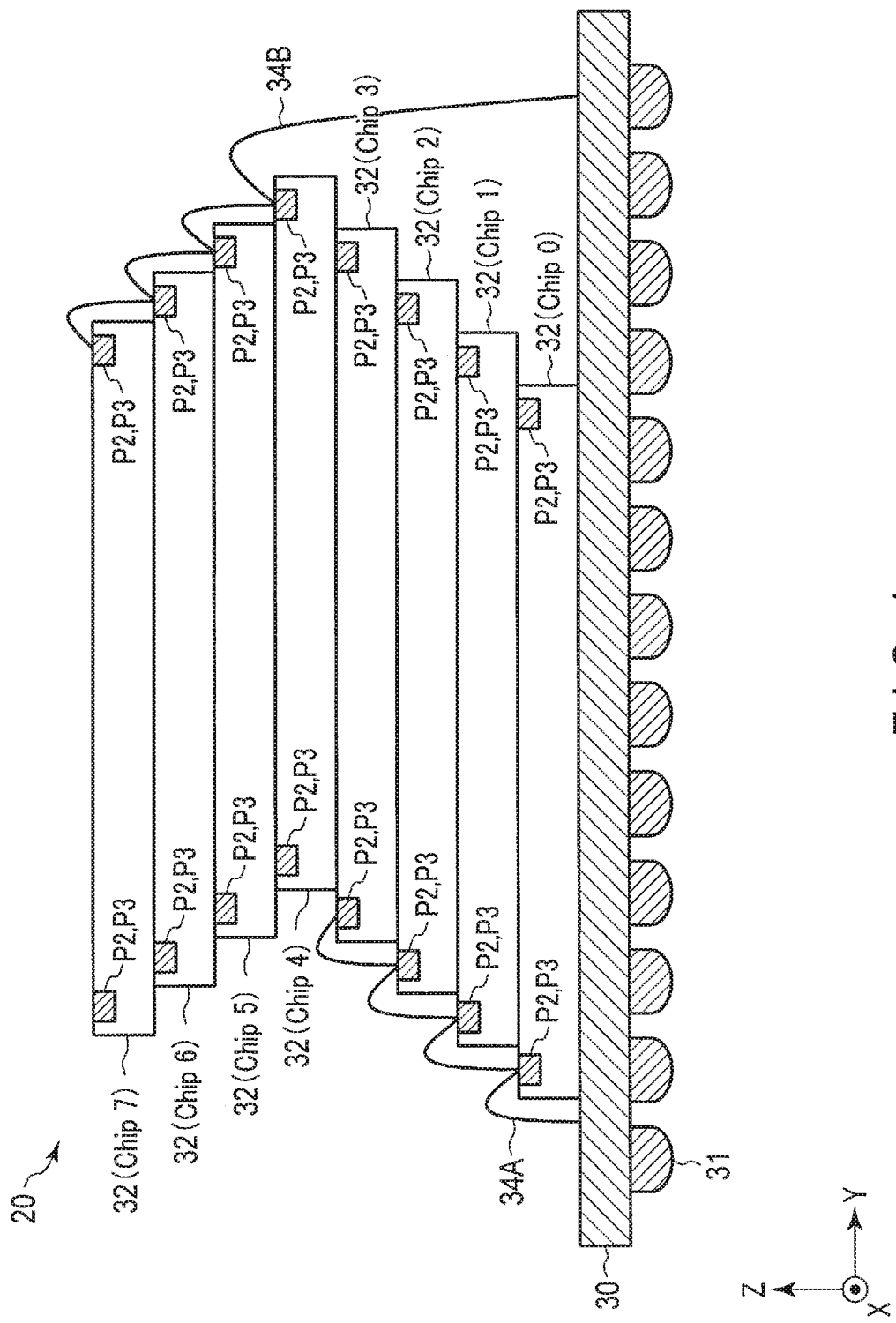
FIG. 4 is a cross-sectional view for describing the configuration of the semiconductor storage device according to the first embodiment.

Next, referring to FIG. 3 and FIG. 4, a description will be given of the state of wiring for voltage supply to each of the chips of the semiconductor storage device. FIG. 3 and FIG. 4 illustrate an example of a cross-sectional configuration in a case in which each of the chips of the semiconductor storage device according to the first embodiment is connected to a package substrate by bonding wires. FIG. 3 and FIG. 4 schematically illustrate bonding wires which are connected to the pads P1, and to pads P2 or P3 of the semiconductor storage device 20. In FIG. 3 and FIG. 4, insulation layers are omitted for the purpose of simplicity.

In the description below, a plane, which is parallel to the surface of the package substrate (semiconductor substrate) 30, is defined as an XY plane, and a direction perpendicular to the XY plane is defined as a Z direction. In addition, it is assumed that an X direction and a Y direction are perpendicular to each other, and that, in FIG. 3 and FIG. 4, the right side (as facing the drawing sheets) is defined as a "+Y direction", and the left side is defined as a "−Y direction". The upper side (as facing the drawing sheets) is defined as a "+Z direction".

As illustrated in FIG. 3 and FIG. 4, bumps 31 are provided on a lower surface of the package substrate 30. The package substrate 30 is electrically connected to the outside of the semiconductor storage device 20 via the bumps 31. In addition, a plurality of semiconductor chips (chip 0 to chip 7) 32 are provided above the package substrate 30. Specifically, the chip 0 is provided on the upper surface of the package substrate 30, and a chip (n+1) is successively stacked on a chip n (n is an integer of 0≤n<7). The chip (n+1) is stacked, for example, by being shifted relative to the chip n in the Y direction. In the example of FIG. 3 and FIG. 4, the chip 1 to chip 4 are stacked by being shifted relative to the chip 0 to chip 3 in the +Y direction, and the chip 5 to chip 7 are stacked by being shifted relative to the chip 4 to chip 6 in the −Y direction.

In addition, as illustrated in FIG. 3, on upper parts of the chip 0 to chip 7, for example, pads P1 are provided near both ends in the Y direction. Thus, by stacking the chips by shifting them in the Y direction, as described above, at least one of the pads P1 of each of the chip 0 to chip 7 is exposed without being covered by the other chip that is stacked on the upper surface of the chip 0 to chip 7.

The pads P1, which are exposed on the upper surfaces of the chip 0 and chip 4, are electrically connected to the package substrate 30 via bonding wires 33A and 33B. The package substrate 30 includes current paths (not shown), which electrically connect the bonding wires 33A and 33B to the corresponding bumps 31.

However, as illustrated in FIG. 4, on upper parts of chip 0 to chip 7, for example, similar to pads P1, pads P2 and P3 are provided near both ends in the Y direction. In addition, by stacking the chips by shifting each chip in the Y direction, as described above, at least one of the pads P2 and at least one of the pads P3 of chip 0 to chip 7 are exposed without being covered by the upper chip that is stacked on the upper surfaces of the chip 0 to chip 7.

The pads P2 and P3, which are exposed on the upper surfaces of the chip 0 and chip 3, are commonly electrically connected to the package substrate 30 via a bonding wire 34A. Similarly, the pads P2 and P3, which are exposed on the upper surfaces of the chip 4 and chip 7, are commonly electrically connected to the package substrate 30 via a bonding wire 34B. The package substrate 30 includes current paths (not shown), which electrically connect the bonding wires 34A and 34B to the corresponding bumps 31.

1.1.4 Re: Configuration of Power Supply Protection Circuit

Next, referring to FIG. 5, the configuration of the power supply protection circuit of the semiconductor storage device according to the first embodiment will be described. The configuration of the power supply protection circuit 23 illustrated in FIG. 5 is the configuration common to the chip 0 to chip 7.

Figure 5:
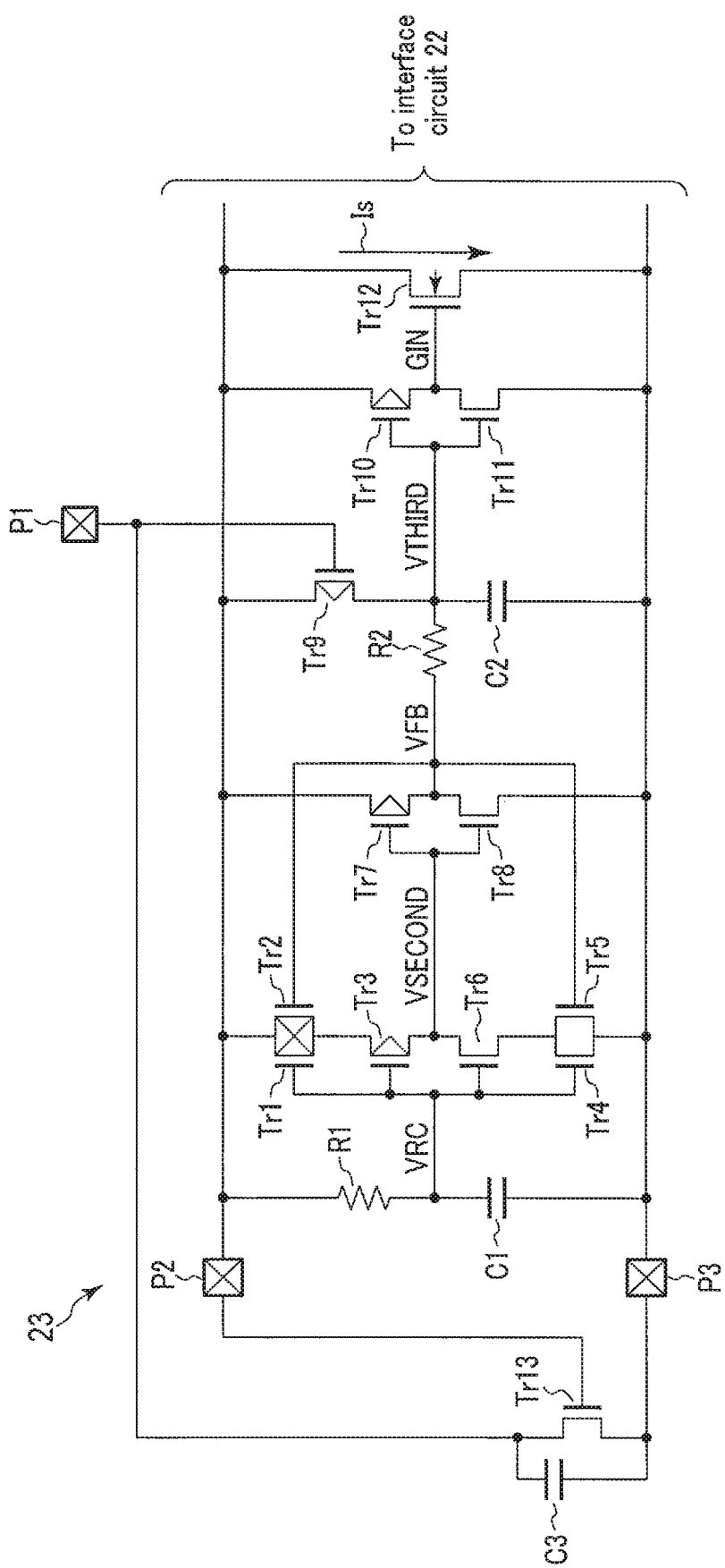
FIG. 5 is a circuit diagram for describing the configuration of a power supply protection circuit of the semiconductor storage device according to the first embodiment.

As illustrated in FIG. 5, the power supply protection circuit 23 includes transistors Tr1, Tr2, Tr3, Tr4, Tr5, Tr6, Tr7, Tr8, Tr9, Tr10, Tr11, Tr12, and Tr13, resistors R1 and R2, and capacitors C1, C2, and C3. Each of the transistors Tr1 to Tr3, Tr7, Tr9, and Tr10 has, for example, a p-channel polarity. Each of the transistors Tr4 to Tr6, Tr8, Tr11, Tr12, and Tr13 has, for example, an n-channel polarity. The transistors Tr1 to Tr8, and Tr10 to Tr12, resistors R1 and R2, and capacitors C1 and C2 can function as an RCTMOS (Resistance Capacitor Trigger Metal Oxide Semiconductor) circuit.

As described above, the voltages VCCQ, VCCQ and VSS are supplied to the power supply protection circuits 23 of the chip 0 and chip 4 via the pads P1 to pads P3, respectively. In addition, as described above, the voltages VCCQ and VSS are supplied to the power supply protection circuits 23 of the chip 1 to chip 3 and the chip 5 to chip 7 via the pads P2 and pads P3, respectively, but the voltage VCCQ is not supplied via the pads P1. Specifically, the pads P1 of the power supply protection circuits 23 of the chip 1 to chip 3 and the chip 5 to chip 7 are in the open state.

The resistor R1 includes a first end connected to the pad P2, and a second end connected to a node VRC. The capacitor C1 includes a first end connected to the pad P3, and a second end connected to the node VRC.

A transistor Tr1 includes a first end connected to the pad P2, a second end connected to a first end of a transistor Tr3, and a gate connected to the node VRC. A transistor Tr2 includes a first end connected to the pad P2, a second end connected to the first end of the transistor Tr3, and a gate connected to a node VFB. A transistor Tr3 includes a second end connected to a node VSECOND, and a gate connected to the node VRC.

A transistor Tr4 includes a first end connected to the pad P3, a second end connected to a first end of a transistor Tr6, and a gate connected to the node VRC. A transistor Tr5 includes a first end connected to the pad P3, a second end connected to the first end of the transistor Tr6, and a gate connected to the node VFB. Transistor Tr6 includes a second end connected to the node VSECOND, and a gate connected to the node VRC.

The transistors Tr1, Tr2, Tr4, and Tr5 have a function of providing a hysteresis for the power supply protection circuit 23 to stably operate, when the voltage VCCQ of the pad P2 varies. The transistors Tr3 and Tr6 function as an inverter.

A transistor Tr7 includes a first end connected to the pad P2, a second end connected to the node VFB, and a gate connected to the node VSECOND. A transistor Tr8 includes a first end connected to the pad P3, a second end connected to the node VFB, and a gate connected to the node VSECOND. The transistors Tr7 and Tr8 function as an inverter.

A transistor Tr9 includes a first end connected to the pad P2, a second end connected to a node VTHIRD, and a gate connected to the pad P1. It is preferable that the gate width of the transistor Tr9 is greater than the gate width of each of the transistors Tr1 to Tr8, Tr10, Tr11, and Tr13. When the pad P1 is in the open state, the transistor Tr9 is always in the ON state, and transfers the voltage VCCQ to the node VTHIRD. However, when the voltage VCCQ is supplied to the pad P1, the transistor Tr9 is always in the OFF state, and disconnects the node VTHIRD from the pad P2. A resistor R2 includes a first end connected to the node VFB, and a second end connected to the node VTHIRD. A capacitor C2 includes a first end connected to the pad P3, and a second end connected to the node VTHIRD.

A transistor Tr10 includes a first end connected to the pad P2, a second end connected to a node GIN, and a gate connected to the node VTHIRD. A transistor Tr11 includes a first end connected to the pad P3, a second end connected to the node GIN, and a gate connected to the node VTHIRD. The transistors Tr10 and Tr11 function as an inverter.

A transistor Tr12 includes a first end connected to the pad P2, a second end connected to the pad P3, and a gate connected to the node GIN. The transistor Tr12 has a function of entering the ON state when the voltage of the pad P2 has sharply risen, and causing a current Is to flow from the first end to second end thereof, thereby mitigating the influence on the interface circuit 22 due to the sharp change of the voltage of the pad P2. The gate width of the transistor Tr12 is greater than the gate width of each of the other transistors Tr1 to Tr11, and Tr13.

A transistor Tr13 includes a first end connected to the pad P1, a second end connected to the pad P3, and a gate connected to the pad P2. It is preferable that the gate width of the transistor Tr13 is less than the gate width of each of the transistors Tr1 to Tr12. A capacitor C3 includes a first end connected to the pad P1, and a second connected to the pad P3. The transistor Tr13 and capacitor C3 have a function of keeping the voltage, which is supplied to the gate of the transistor Tr9, at VSS when the pad P1 is in the open state. The transistor Tr13 and capacitor C3 may be shared by a plurality of power supply protection circuits 23.

It is preferable that the transistors Tr1 to Tr13 are switched to the ON state or to the OFF state, for example, at a certain voltage (to be referred to as "voltage VT" for the purpose of convenience) between the voltage VCCQ and voltage VSS. To be more specific, each of the transistors Tr1 to Tr3, Tr7, Tr9, and Tr10 enters the ON state if a voltage lower than the voltage VT is applied to the gate thereof, and enters the OFF state if a voltage higher than the voltage VT is applied to the gate thereof. Besides, each of the transistors Tr4 to Tr6, Tr8, Tr11, Tr12, and Tr13 enters the OFF state if a voltage lower than the voltage VT is applied to the gate thereof, and enters the ON state if a voltage higher than the voltage VT is applied to the gate thereof. In this manner, as regards the transistor with the p-channel polarity and the transistor with the n-channel polarity, it is preferable that when one of them is in the ON state, the other is in the OFF state, and when one of them is in the OFF state, the other is in the ON state. In the description below, as regards voltages which are applied to the gates of the transistors Tr1 to Tr13, a voltage lower than the voltage VT is referred to as the "L" level, and a voltage higher than the voltage VT is referred to as the "H" level.

1.2 Re: Operation of Power Supply Protection Circuit

Figure 6:
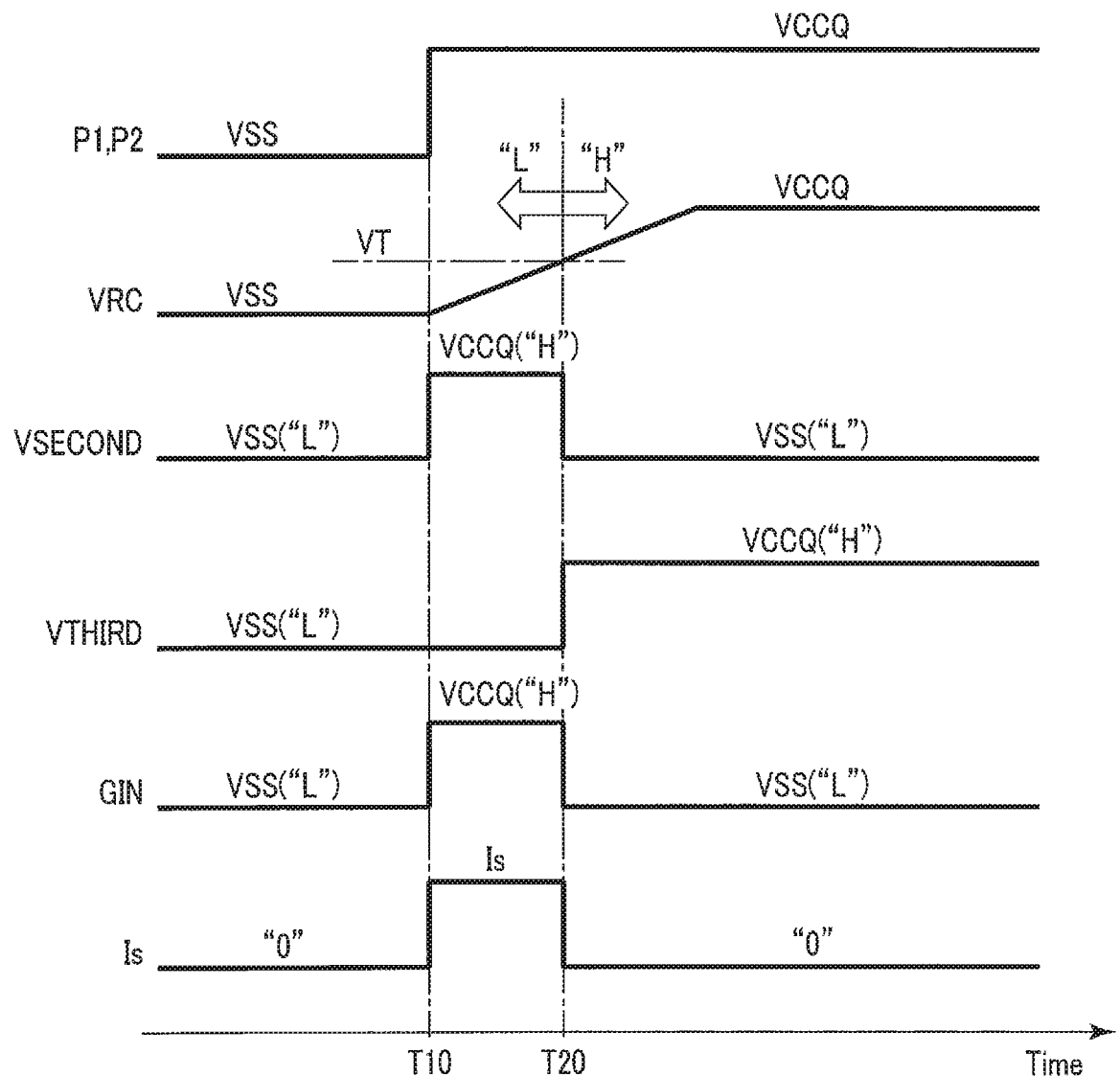
FIG. 6 is a timing chart for describing the operation of the power supply protection circuit of the semiconductor storage device according to the first embodiment.
Figure 7:
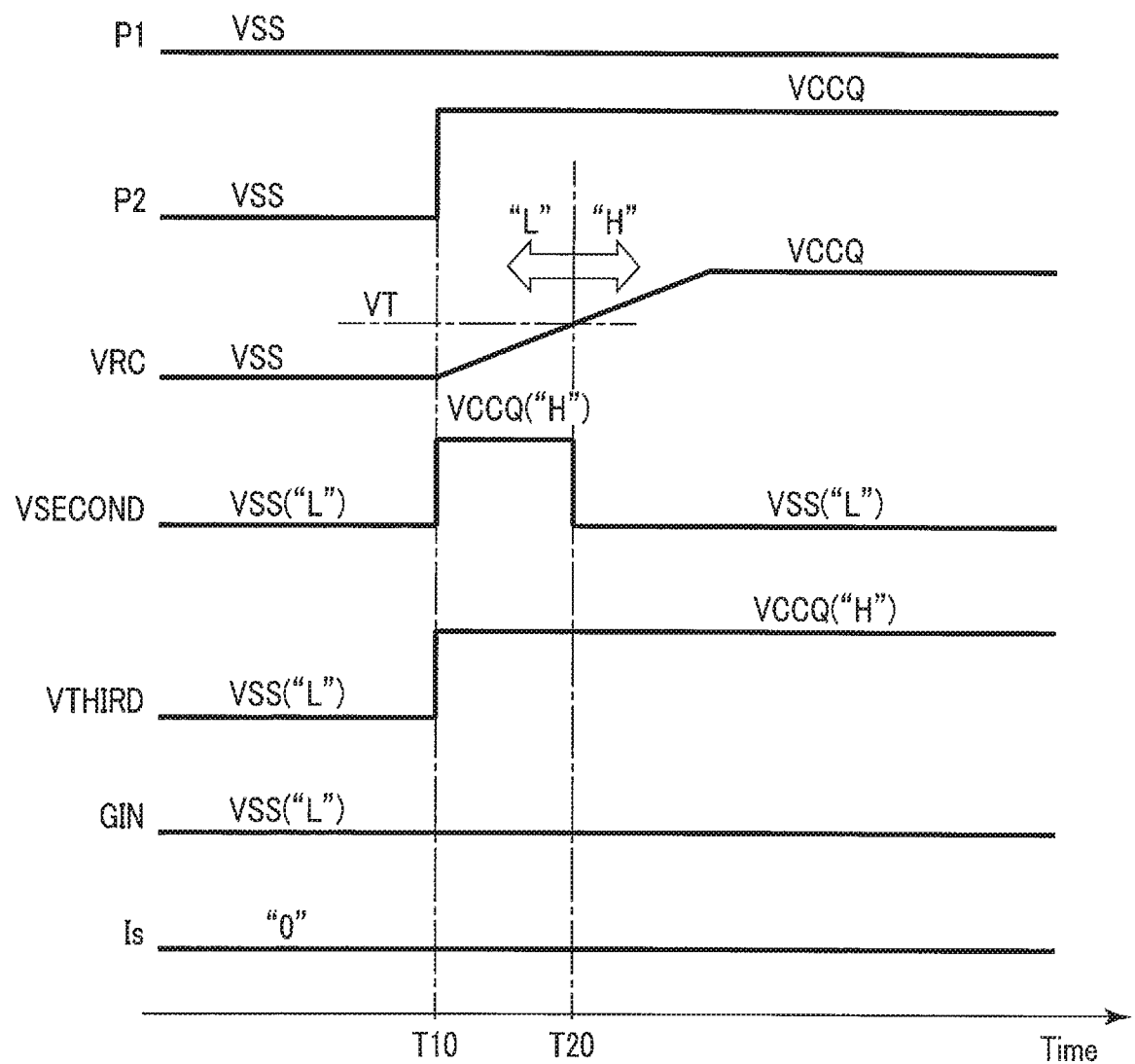
FIG. 7 is a timing chart for describing the operation of the power supply protection circuit of the semiconductor storage device according to the first embodiment.

Next, referring to FIG. 6 and FIG. 7, a description will be given of the operation of the power supply protection circuit of the semiconductor storage device according to the first embodiment. FIG. 6 and FIG. 7 respectively illustrate the operation of the power supply protection circuit 23 of each of the chip 0 and chip 4 at the time of power-on, and the operation of the power supply protection circuit 23 of each of the chip 1 to chip 3 and the chip 5 to chip 7 at the time of power-on.

As illustrated in FIG. 6, in the chip 0 and chip 4, the voltage VCCQ is not supplied to the semiconductor storage device 20 until time instant T10. Thus, the pads P1 and P2 have, for example, the voltage VSS. In accordance with this, the nodes VRC, VSECOND, VTHIRD, and GIN have the voltage VSS ("L" level). Accordingly, the transistor Tr12 is in the OFF state, and the current Is does not flow.

At time instant T10, the voltages VCCQ and VSS are supplied to the semiconductor storage device 20. In accordance with this, the transistor Tr13 enters the ON state, and the capacitor C3 is charged. In addition, the transistor Tr9 enters the OFF state, and the node VTHIRD is disconnected from the pad P2.

When the voltage supply performance of an external power supply, which supplies a voltage to the semiconductor storage device 20, is high, the voltage of the pad P2 sharply rises, and, for example, quickly reaches the voltage VCCQ. The voltage of the node VRC begins to gradually increase, as an electric charge is being fully accumulated in the capacitor C1. Thus, at time instant T10, the voltage of the node VRC does not sharply rise to VCCQ, and remains at the "L" level. In accordance with this, the transistors Tr1 and Tr3 enter the ON state, and the transistors Tr4 and Tr6 enter the OFF state. The node VSECOND is electrically connected to the pad P2, and the voltage of the VSECOND rises to the "H" level. Accordingly, the transistor Tr7 enters the OFF state, and the transistor Tr8 enters the ON state. The node VTHIRD is electrically connected to the pad P3, and has "L" level. In accordance with this, the transistor Tr10 enters the ON state, and the transistor Tr11 enters the OFF state. The node GIN is electrically connected to the pad P2, and the voltage of the node GIN rises to the "H" level. Accordingly, the transistor Tr12 enters the ON state, and the current Is flows from the first end to second end thereof.

At time instant T20, as the capacitor C1 is being charged, the voltage of the node VRC reaches VT. In other words, after time instant T20, the voltage of the node VRC becomes the "H" level. In accordance with this, the transistor Tr1 and transistor Tr3 enter the OFF state, and the transistors Tr4 and Tr6 enter the ON state. The node VSECOND is electrically connected to the pad P3, and the voltage of the node VSECOND lowers to the "L" level. Accordingly, the transistor Tr7 enters the ON state, and the transistor Tr8 enters the OFF state. The node VTHIRD is electrically connected to the pad P2, and the voltage of the node VTHIRD rises to the "H" level. In accordance with this, the transistor Tr10 enters the OFF state, and the transistor Tr11 enters the ON state. The node GIN is electrically connected to the pad P3, and the voltage of the node GIN lowers to the "L" level. Accordingly, the transistor Tr12 enters the OFF state, and the current Is stops.

Thereby, during the period between time instant T10 and time instant T20, the current Is flows in the power supply protection circuits 23 of the chip 0 and chip 4.

On the other hand, as illustrated in FIG. 7, in the chip 1 to chip 3 and the chip 5 to chip 7, the operation up to time instant T10 is the same as in the chip 0 and chip 4.

At time instant T10, the voltage VCCQ and VSS are supplied to the semiconductor storage device 20. In accordance with this, in the chip 1 to chip 3 and the chip 5 to chip 7, the nodes VRC and VSECOND operate in the same manner as in the chip 0 and chip 4.

Although the transistor Tr13 enters the ON state, the voltage VCCQ is not supplied from the pad P1, and thus the voltage VSS is supplied to the gate of the transistor Tr9. The transistor Tr9 enters the ON state, and the node VTHIRD is electrically connected to the pad P2. Accordingly, the capacitor C2 is charged.

Thus, after time instant T10, the nodes VTHIRD and GIN are at the "H" level and "L" level, respectively, regardless of the level of the node VSECOND. Accordingly, the current Is does not flow in the chip 1 to chip 3 and the chip 5 to chip 7.

By the above, the operation of the power supply protection circuit is completed.

1.3 Advantageous Effects of the Present Embodiment

According to the first embodiment, a through-current, which flows at a time of power-on, can be reduced. The advantageous effects of the first embodiment will be described below.

With the development in enhancement of data transfer speed, designs which use transistors that contain thin gate oxide films and are capable of performing high-speed operations, have been made. The transistor with a thin gate oxide film has low robustness when a high voltage is applied to the gate. Thus, in the case of using, for example, a power supply protection circuit which operates at a high voltage, such as a snap-back element, it is possible that, when ESD (Electrostatic Discharge) stress occurs, the transistor is destroyed before the power supply protection circuit operates. Thus, a method of using, in the power supply protection circuit, an RCTMOS circuit which reliably operates at a lower voltage has been proposed.

However, the RCTMOS circuit is configured to forcibly short-circuit a power supply and a ground, when ESD stress occurs. Thus, when a supplied voltage has sharply changed, it is possible that a large through-current flows in the semiconductor storage device. Therefore, for example, when a semiconductor storage device, in which a plurality of chips are stacked, is connected to a power supply with a high voltage supply performance, it is possible that, at a time of power-on, an unintended through-current flows at the same time to all chips in the semiconductor storage device.

According to the first embodiment, the voltage VCCQ is commonly supplied to the pads P2 of the chip 0 to chip 7. On the other hand, although the voltage VCCQ is supplied to the pads P1 of the chip 0 and chip 4, the voltage VCCQ is not supplied to the pads P1 of the chip 1 to chip 3 and the chip 5 to chip 7, and the pads P1 of the chip 1 to chip 3 and the chip 5 to chip 7 are set in the open state. Each of the power supply protection circuits 23 of the chip 0 to chip 7 has the configuration of the RCTMOS circuit, and also includes the transistor Tr9 which includes the first end connected to the pad P2, the second end connected to the node VTHIRD, and the gate connected to the pad P1. Thereby, while a voltage, which is equal to or higher than the voltage VT, is being applied to the pads P1, the transistor Tr9 is always in the OFF state in the chip 0 and chip 4 and, on the other hand, the transistor Tr9 is always in the ON state in the chip 1 to chip 3 and the chip 5 to chip 7. Thus, when a surge occurs in the voltage VCCQ which is supplied to the pad P2, the transistor Tr12 enters the ON state in the chip 0 and chip 4, and the current Is can be made to flow. However, in the chip 1 to chip 3 and the chip 5 to chip 7, the transistor Tr12 is always in the OFF state, and the current Is does not flow. Accordingly, when it is possible for the voltage VCCQ to sharply rise, for example, as in the case of the power-on time, the current Is can be prevented from flowing in the power supply protection circuits 23 of the chip 1 to chip 3 and the chip 5 to chip 7.

Additionally, the power supply protection circuit 23 includes the transistor Tr13 and the capacitor C3. Transistor Tr13 includes the first end connected to the pad P1, the second end connected to the pad P3, and the gate connected to the pad P2. Capacitor C3 includes the first end connected to the pad P1, and the second end connected to the pad P3. Thereby, the voltage, which is supplied to the gate of the transistor Tr9, can be set to the voltage VCCQ when the voltage VCCQ is supplied to the pad P1, and can be set to the voltage VSS when the voltage VCCQ is not supplied to the pad P1. Accordingly, the operation of the power supply protection circuit 23 can be stabilized.

Additionally, the chip 1 to chip 3 is provided above the chip 0 with respect to the package substrate 30. Thereby, the voltage VCCQ, which is supplied from the package substrate 30, is first supplied by the bonding wire 33A to the circuit in the chip 0 among the chip 0 to chip 3. Thus, when ESD stress occurs, a voltage surge is transferred to the power supply protection circuit 23 in the chip 0 before the voltage surge reaches the chip 1 to chip 3. Accordingly, as described above, even when the power supply protection circuits 23 in the chip 1 to chip 3 do not operate, all of the chip 0 to chip 3 in the same channel 0 can be protected by operating the power supply protection circuit 23 in the chip 0.

Additionally, when a plurality of power supply protection circuits 23 are disposed in the same chip, the transistor Tr13 and capacitor C3 are shared by the plural power supply protection circuits 23. Thereby, the circuit area can be reduced.

1.4 Modification of the First Embodiment

The semiconductor storage device according to the first embodiment is not limited to the above example, and various modifications are applicable.

For example, as illustrated in FIG. 8, the power supply protection circuit 23 may be configured to further include a transistor Tr14 which includes a first end connected to the pad P2, a second end connected to the node VRC, and a gate connected to the pad P1. The transistor Tr14 is always in the OFF state in the chip 0 and chip 4, and is always in the ON state in the chip 1 to chip 3 and the chip 5 to chip 7.

Thereby, the transistor Tr14 does not affect the operation of the RCTMOS circuit in the chip 0. On the other hand, in the chip 1 to chip 3, the voltage of the node VRC can be set at the "H" level, at the same time as the voltage VCCQ is supplied to the pad P2. Thus, the voltage of the node VTHIRD can stably be set at the "H" level, and, by extension, the transistor Tr12 can stably be set in the OFF state.

2. Second Embodiment

Next, a semiconductor storage device according to a second embodiment will be described. The semiconductor storage device according to the first embodiment is configured so that the power supply protection circuit 23 of the chip 0 operates by the voltage VCCQ being supplied to the pad P1, and the power supply protection circuits 23 of the chip 1 to chip 3 do not operate by the voltage VCCQ not being supplied to the pads P1. On the other hand, the semiconductor storage device according to the second embodiment is configured so that the power supply protection circuit 23 of the chip 0 operates by the voltage VCCQ not being supplied to the pad P1, and the power supply protection circuits 23 of the chip 1 to chip 3 do not operate by the voltage VCCQ being supplied to the pads P1. In the description below, the same structural elements as in the first embodiment are denoted by the same reference numerals, and a description thereof is omitted. Only those parts different from the first embodiment will be described.

2.1 Re: Configuration of Semiconductor Storage Device

Referring to FIG. 9, a configuration example of the semiconductor storage device according to the second embodiment will be described. FIG. 9 corresponds to FIG. 2 in the first embodiment. Like FIG. 2, FIG. 9 illustrates that part of the semiconductor storage device 20, which relates to the channel 0. Since channel 1 has the same configuration as channel 0, channel 0 will be described below, and a description of the configuration of channel 1, which overlaps the configuration of channel 0, will be omitted.

The voltage VCCQ is supplied to only the pads P1 of the chip 1 to chip 3, and is not supplied to the pad P1 of the chip 0. In addition, the voltages VCCQ and VSS are supplied to the pads P2 and P3 of the respective chips via interconnects which are common to the chips within the chip 0. In the example of FIG. 9, although the pads P1 to P3 are illustrated as one functional block, they are not limited to this, and a plurality of pads P1 to P3 may be provided. When a plurality of pads P1 to P3 are provided in one chip, these pads P1 to P3 may be laid out in a distributed fashion at a plurality of locations within the chip.

Figure 10:
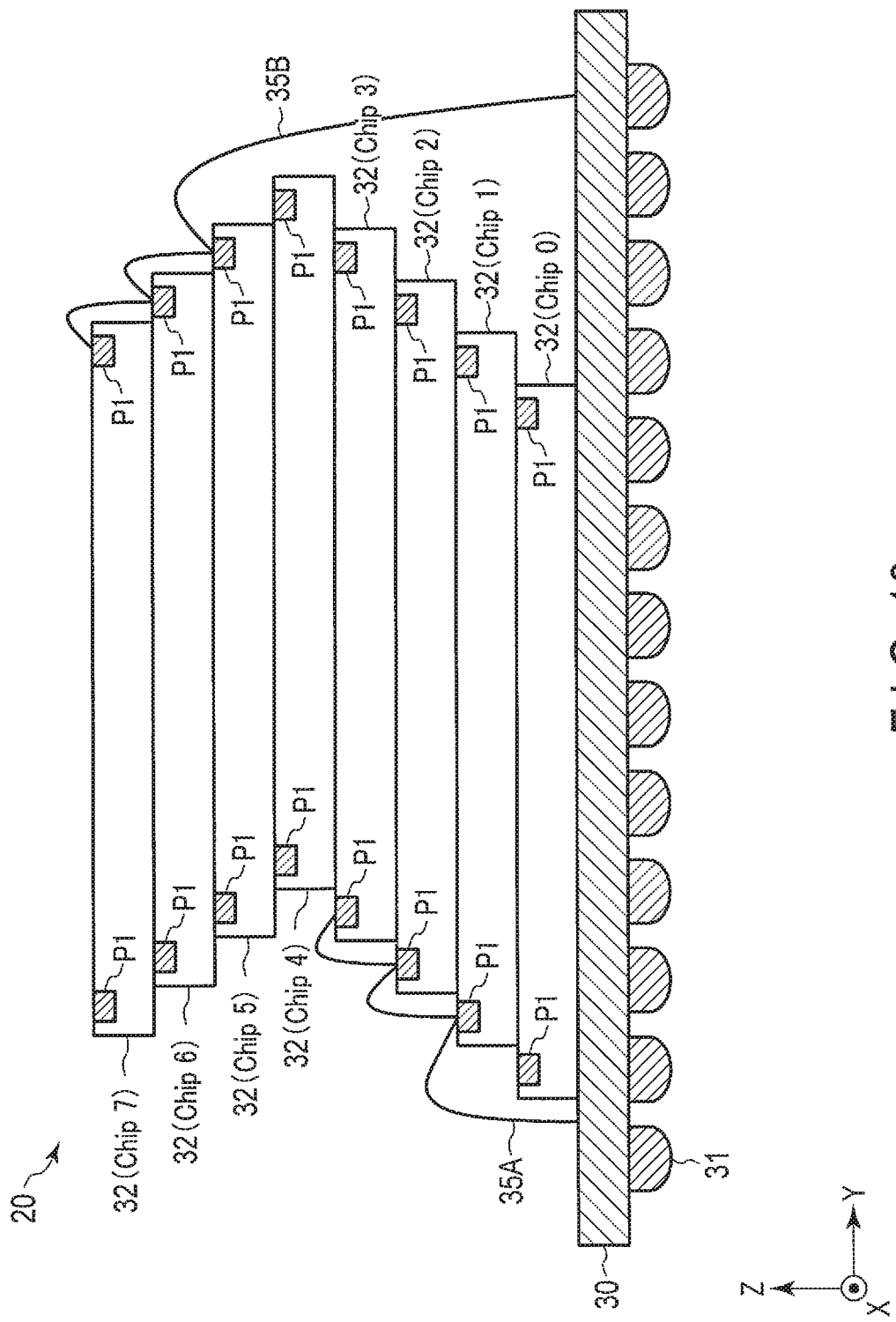
FIG. 10 is a cross-sectional view for describing the configuration of the semiconductor storage device according to the second embodiment.

Next, referring to FIG. 10, a description will be given of the state of wiring for voltage supply to each of the chips of the semiconductor storage device. FIG. 10 corresponds to FIG. 3 in the first embodiment. FIG. 10 schematically illustrates bonding wires which are connected to the pads P1 of the semiconductor storage device 20. In FIG. 10, insulation layers are omitted for the purpose of simplicity.

As illustrated in FIG. 10, the pads P1, which are exposed on the upper surfaces of the chip 1 to chip 3 and the chip 5 to chip 7, are electrically connected to the package substrate 30 via bonding wires 35A and 35B. The package substrate 30 includes current paths (not shown), which electrically connect the bonding wires 35A and 35B to the corresponding bumps 31.

2.2 Re: Configuration of Power Supply Protection Circuit

Next, referring to FIG. 11, the configuration of the power supply protection circuit of the semiconductor storage device according to the second embodiment will be described. FIG. 11 corresponds to FIG. 5 in the first embodiment. The configuration of the power supply protection circuit 23 illustrated in FIG. 11 is the configuration common to the chip 0 to chip 7.

As illustrated in FIG. 11, the power supply protection circuit 23 includes transistors Tr1, Tr2, Tr3, Tr4, Tr5, Tr6, Tr7, Tr8, Tr9, Tr10, Tr11, Tr12, and Tr13, resistors R1 and R2, capacitors C1, C2, and C3, and an inverter NV1. Since the configurations of the transistors Tr1 to Tr13, resistors R1 and R2, and capacitors C1 to C3 are the same as illustrated in FIG. 5, a description thereof is omitted.

As described above, the voltages VCCQ, VCCQ and VSS are supplied to the power supply protection circuits 23 of the chip 1 to chip 3 and the chip 5 to chip 7 via the pads P1 to P3, respectively. In addition, as described above, the voltages VCCQ and VSS are supplied to the power supply protection circuits 23 of the chip 0 and chip 4 via the pads P2 and pads P3, respectively, but the voltage VCCQ is not supplied via the pads P1. Specifically, the pads P1 of the power supply protection circuits 23 of the chip 0 and chip 4 are in the open state.

The inverter NV1 includes an input terminal connected to the pad P1, and an output terminal connected to the gate of the transistor Tr9. Thus, when the pad P1 is in the open state, the transistor Tr9 is always in the OFF state, and disconnects the node VTHIRD from the pad P2. However, when the voltage VCCQ is supplied to the pad P1, the transistor Tr9 is always in the ON state, and transfers the voltage VCCQ to the node VTHIRD.

2.3 Re: Operation of Power Supply Protection Circuit

Figure 12:
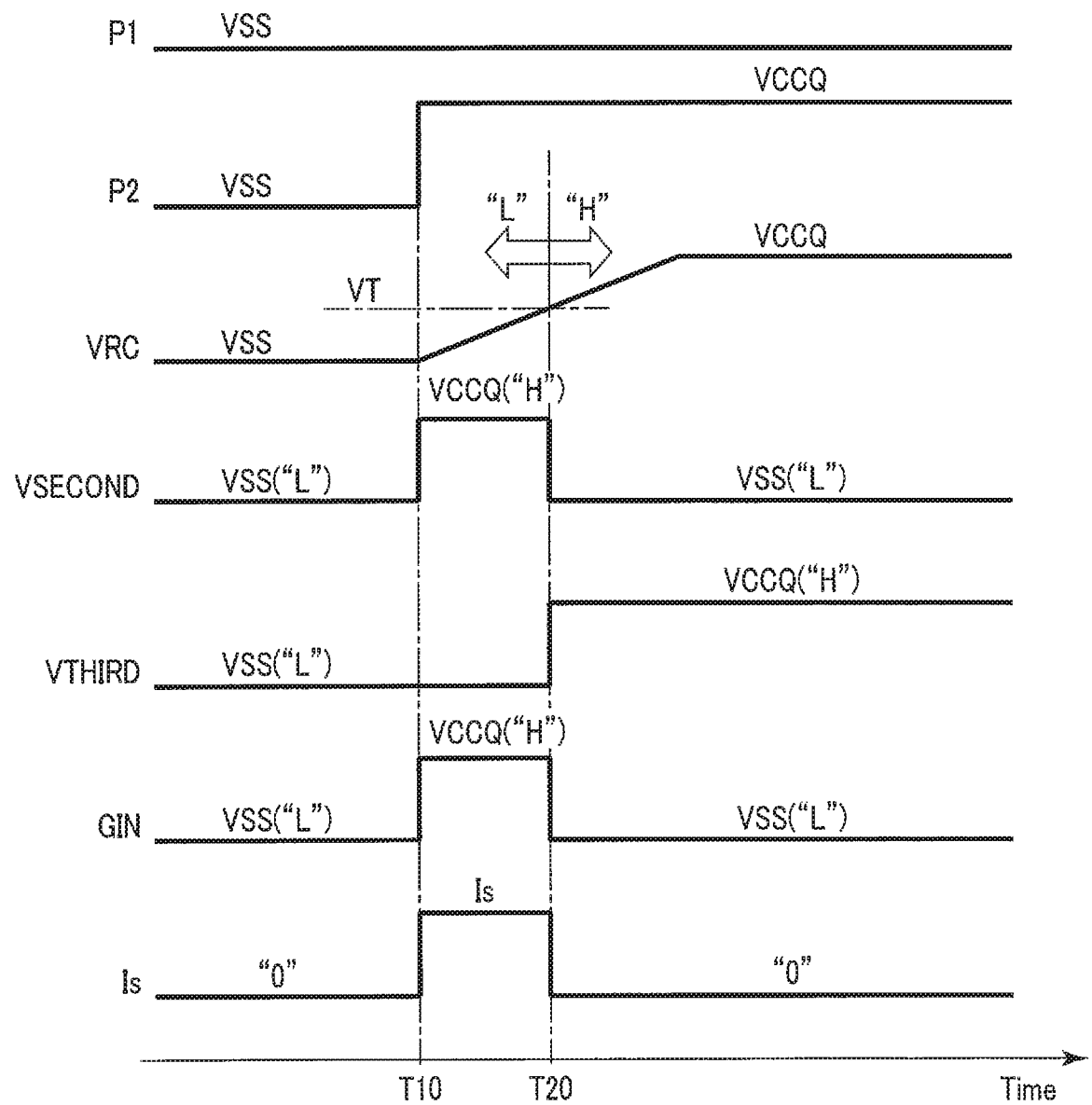
FIG. 12 is a timing chart for describing the operation of the power supply protection circuit of the semiconductor storage device according to the second embodiment.
Figure 13:
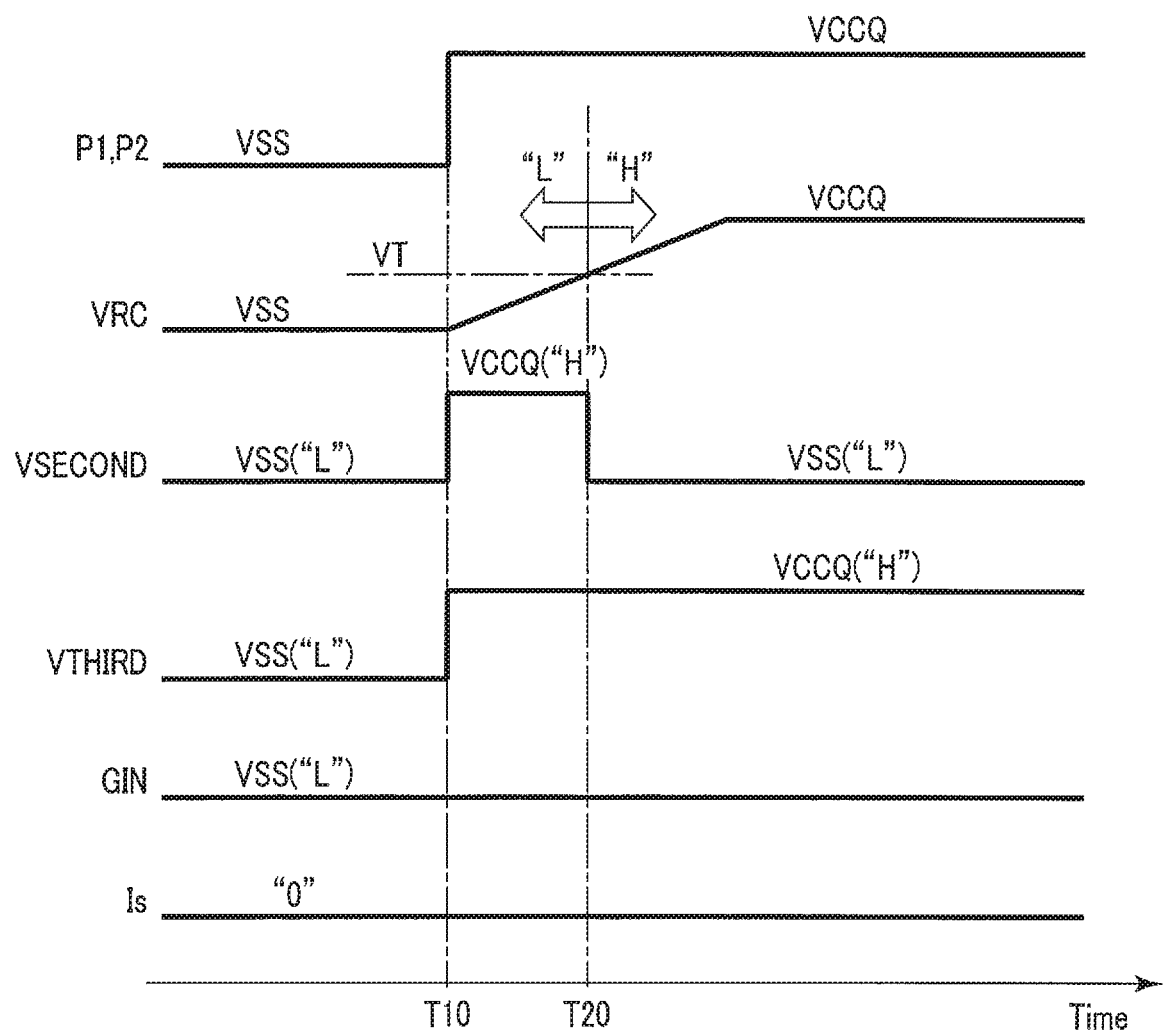
FIG. 13 is a timing chart for describing the operation of the power supply protection circuit of the semiconductor storage device according to the second embodiment.

Next, referring to FIG. 12 and FIG. 13, a description will be given of the operation of the power supply protection circuit of the semiconductor storage device according to the second embodiment. FIG. 12 and FIG. 13 correspond to FIG. 6 and FIG. 7 in the first embodiment, respectively. Specifically, FIG. 12 and FIG. 13 illustrate, respectively, the operation of the power supply protection circuit 23 of each of the chip 0 and chip 4 at the time of power-on, and the operation of the power supply protection circuit 23 of each of the chip 1 to chip 3 and the chip 5 to chip 7 at the time of power-on.

As illustrated in FIG. 12, since the operation up to time instant T10 is the same as in FIG. 6, a description thereof is omitted.

At time instant T10, the voltages VCCQ and VSS are supplied to the chip 0 and chip 4, and the transistor Tr13 enters the ON state. However, since the voltage VCCQ is not supplied from the pad P11, the capacitor C3 is not charged. Thus, the voltage VSS ("L" level) is supplied to the input terminal of the inverter NV1, and the inverter NV1 outputs the "H" level from the output terminal. Thereby, the transistor Tr9 enters the OFF state, and the node VTHIRD is disconnected from the pad P2.

The operation after time instant T20 is the same as in FIG. 6, so a description thereof is omitted.

On the other hand, as illustrated in FIG. 13, in the chip 1 to chip 3 and the chip 5 to chip 7, the operation up to time instant T10 is the same as in the chip 0 and chip 4.

At time instant T10, the voltage VCCQ and VSS are supplied to the semiconductor storage device 20. In accordance with this, the transistor Tr13 enters the ON state, and the capacitor C3 is charged. The "H" level is supplied to the input terminal of the inverter NV1, and the "L" level is output from the output terminal of the inverter NV1. Thereby, the transistor Tr9 enters the ON state, and the node VTHIRD is electrically connected to the pad P2. Accordingly, the capacitor C2 is charged.

Since the operation after time instant T20 is the same as in FIG. 7, a description thereof is omitted.

By the above, the operation of the power supply protection circuit is completed.

2.4 Advantageous Effects of the Present Embodiment

According to the second embodiment, the voltage VCCQ is commonly supplied to the pads P2 of the chip 0 to chip 7. On the other hand, although the voltage VCCQ is supplied to the pads P1 of the chip 1 to chip 3 and the chip 5 to chip 7, the voltage VCCQ is not supplied to the pads P1 of the chip 0 and chip 4, and the pads P1 of the chip 0 and chip 4 are set in the open state. Each of the power supply protection circuits 23 of the chip 0 to chip 7 has the configuration of the RCTMOS circuit, and also includes the transistor Tr9 and inverter NV1. The inverter NV1 includes the input terminal connected to the pad P1, and the output terminal connected to the gate of the transistor Tr9. The transistor Tr9 includes the first end connected to the pad P2, and the second end connected to the node VTHIRD. Thereby, while a voltage, which is equal to or higher than the voltage VT, is being applied to the pads P1, the transistor Tr9 is always in the OFF state in the chip 0 and chip 4 and, on the other hand, the transistor Tr9 is always in the ON state in the chip 1 to chip 3 and the chip 5 to chip 7. Thus, when a surge occurs in the voltage VCCQ which is supplied to the pad P2, the transistor Tr12 enters the ON state in the chip 0 and chip 4, and the current Is can be caused to flow. Meanwhile, in the chip 1 to chip 3 and the chip 5 to chip 7, the transistor Tr12 is always in the OFF state, and the current Is does not flow. Accordingly, when it is possible that the voltage VCCQ sharply rises, for example, as in the case of the power-on time, the current Is can be prevented from flowing in the power supply protection circuits 23 of the chip 1 to chip 3 and the chip 5 to chip 7.

Additionally, according to the second embodiment, the chip 0 does not require the supply of the voltage VCCQ in order for the power supply protection circuit 23 to have the function of passing a through-current. Thus, even when a problem occurs in the voltage supply to the pad P1, the chip 0 can stably operate, compared to the first embodiment in which the chip 0 requires the supply of the voltage VCCQ in order for the power supply protection circuit 23 to have the function of passing a through-current.

Additionally, according to the second embodiment, the same advantageous effects as in the first embodiment and other modes can be obtained.

2.5 Modification of the Second Embodiment

The semiconductor storage device according to the second embodiment is not limited to the above example, and various modifications are applicable.

For example, as illustrated in FIG. 14, the power supply protection circuit 23 may be configured to further include an inverter NV2 and a transistor Tr14. FIG. 14 corresponds to FIG. 8 relating to the modification of the first embodiment. The inverter NV2 includes an input terminal connected to the pad P1, and an output terminal connected to the gate of the transistor Tr14. The transistor Tr14 includes a first end connected to the pad P2, and a second end connected to the node VRC. The transistor Tr14 is always in the OFF state in the chip 0 and chip 4, and is always in the ON state in the chip 1 to chip 3 and the chip 5 to chip 7.

Thereby, like the modification of the first embodiment, the transistor Tr14 does not affect the operation of the RCTMOS circuit in the chip 0 and chip 4. On the other hand, in the chip 1 to chip 3 and the chip 5 to chip 7, the voltage of the node VRC can be set at the "H" level, at the same time as the voltage VCCQ is supplied to the pad P2. Thus, the voltage of the node VTHIRD can stably be set at the "H" level, and, by extension, the transistor Tr12 can stably be set in the OFF state.

3. Third Embodiment

Next, a semiconductor storage device according to a third embodiment will be described. The semiconductor storage devices according to the first embodiment and second embodiment are configured to use the pad P1 which is provided in order to control the power supply protection circuit 23. On the other hand, the semiconductor storage device according to the third embodiment is configured to control the power supply protection circuit 23 by using existing pads, without providing the pad P1. In the description below, the same structural elements as in the first embodiment are denoted by like reference numerals, and a description thereof is omitted. Only those parts different from the first embodiment will be described.

3.1 Re: Configuration of Semiconductor Storage Device

Referring to FIG. 15, a configuration example of the semiconductor storage device according to the third embodiment will be described. FIG. 15 illustrates the configuration of each of the chips in the semiconductor storage device 20 in the third embodiment. In the description below, only the configuration, which is different from the configuration of each chip in the first embodiment, will be described, and the description of the configuration, which is common to the configuration of each chip in the first embodiment, will be omitted.

The pad group 21 does not include the pad P1, and includes pads P4 and P5 for chip identification. The pads P4 and P5 can share the voltage VCCQ with the power supply protection circuit 23. The pad P4 and pad P5 can identify each of the chips in the same channel, based on a combination of the supply and non-supply of the voltage VCCQ.

Next, referring to FIG. 16 and FIG. 17, a description will be given of the state of wiring for voltage supply to the pads P4 and P5 of the semiconductor storage device. FIG. 16 and FIG. 17 schematically illustrate bonding wires which are connected to the pads P4 and P5 of the semiconductor storage device 20. In FIG. 16 and FIG. 17, insulation layers are omitted for the purpose of simplicity.

As illustrated in FIG. 16, the pads P4, which are exposed on the upper surfaces of the chip 1 and chip 3, and the chip 5 and chip 7, are electrically connected to the package substrate 30 via bonding wires 36A and 36B.

In addition, as illustrated in FIG. 17, the pads P5, which are exposed on the upper surfaces of the chip 2 and chip 3, and the chip 6 and chip 7, are electrically connected to the package substrate 30 via bonding wires 37A and 37B.

The package substrate 30 includes current paths (not shown), which electrically connect the bonding wires 36A, 36B, 37A, and 37B to the corresponding bumps 31.

By the above-described configuration, the voltage VCCQ is further supplied to the pads P4 of the chip 1, chip 3, chip 5, and chip 7, and to the pads P5 of the chip 2, chip 3, chip 6, and chip 7. In addition, the voltage VCCQ is supplied to none of the pads P4 and pads P5 of each of the chip 0 and chip 4, the pads P5 of the chip 1 and chip 5, and the pads P4 of the chip 2 and chip 6.

3.2 Re: Configuration of Power Supply Protection Circuit

Next, referring to FIG. 18 and FIG. 19, the configuration of the power supply protection circuit of the semiconductor storage device according to the third embodiment will be described. FIG. 18 corresponds to FIG. 5 in the first embodiment. The configuration of the power supply protection circuit 23 illustrated in FIG. 18 is the configuration common to the chip 0 to chip 7. FIG. 19 illustrates a relationship between voltages which are supplied to the pads P4 and pads P5 in the third embodiment, and voltages which are supplied into the power supply protection circuit 23.

As illustrated in FIG. 18, the power supply protection circuit 23 includes transistors Tr1, Tr2, Tr3, Tr4, Tr5, Tr6, Tr7, Tr8, Tr9, Tr10, Tr11, Tr12, and Tr13, resistors R1 and R2, capacitors C1, C2, and C3, and a negative OR circuit NOR. Since the configurations of the transistors Tr1 to Tr13, resistors R1 and R2, and capacitors C1 to C3 are the same as illustrated in FIG. 5, a description thereof is omitted.

The negative OR circuit NOR includes a first input terminal connected to the pad P4, a second input terminal connected to the pad P5, and an output terminal connected to the gate of the transistor Tr9, to the first end of the transistor Tr13, and to the first end of the capacitor C3. The negative OR circuit NOR operates, for example, with the voltage VCCQ being set as the "H" level, and with a voltage (e.g. voltage VSS) lower than the voltage VCCQ being set as the "L" level. In the description below, a node, which connects the output terminal of the negative OR circuit NOR and the gate of the transistor Tr9, is defined as a node TIN.

As illustrated in FIG. 19, the voltage VCCQ is not supplied to the pads P4 and P5 of the chip 0 and chip 4. Thus, the pads P4 and P5 of the chip 0 and chip 4 are in the open state, and the "L" level (e.g. voltage VSS) is input to the first input terminal and the second input terminal of the negative OR circuit NOR. Accordingly, in the chip 0 and chip 4, the "H" level voltage VCCQ is output to the node TIN as the output of the negative OR circuit NOR.

In addition, in the chip 1 and chip 5, the voltage VCCQ is supplied to the pad P4, while the voltage VCCQ is not supplied to the pad P5. Thus, in the chip 1 and chip 5, the "H" level is input to the first input terminal of the negative OR circuit NOR, and the "L" level is input to the second input terminal of the negative OR circuit NOR. Accordingly, in the chip 1 and chip 5, the "L" level voltage VSS is output to the node TIN as the output of the negative OR circuit NOR.

Besides, in the chip 2 and chip 6, the voltage VCCQ is supplied to the pad P5, while the voltage VCCQ is not supplied to the pad P4. Thus, in the chip 2 and chip 6, the "L" level is input to the first input terminal of the negative OR circuit NOR, and the "H" level is input to the second input terminal of the negative OR circuit NOR. Accordingly, in the chip 2 and chip 6, the "L" level voltage VSS is output to the node TIN as the output of the negative OR circuit NOR.

Furthermore, in the chip 3 and chip 7, the voltage VCCQ is supplied to the pads P4 and P5. Thus, in the chip 3 and chip 7, the "H" level is input to the first input terminal and second input terminal of the negative OR circuit NOR. Accordingly, in the chip 3 and chip 7, the "L" level voltage VSS is output to the node TIN as the output of the negative OR circuit NOR.

As described above, the voltage VSS is supplied to the power supply protection circuits 23 of the chip 1 to chip 3 and the chip 5 to chip 7 via the pads P4 and P5. In addition, the voltage VCCQ is supplied to the power supply protection circuits 23 of the chip 0 and chip 4 via the pads P4 and P5.

3.3 Re: Operation of Power Supply Protection Circuit

Figure 20:
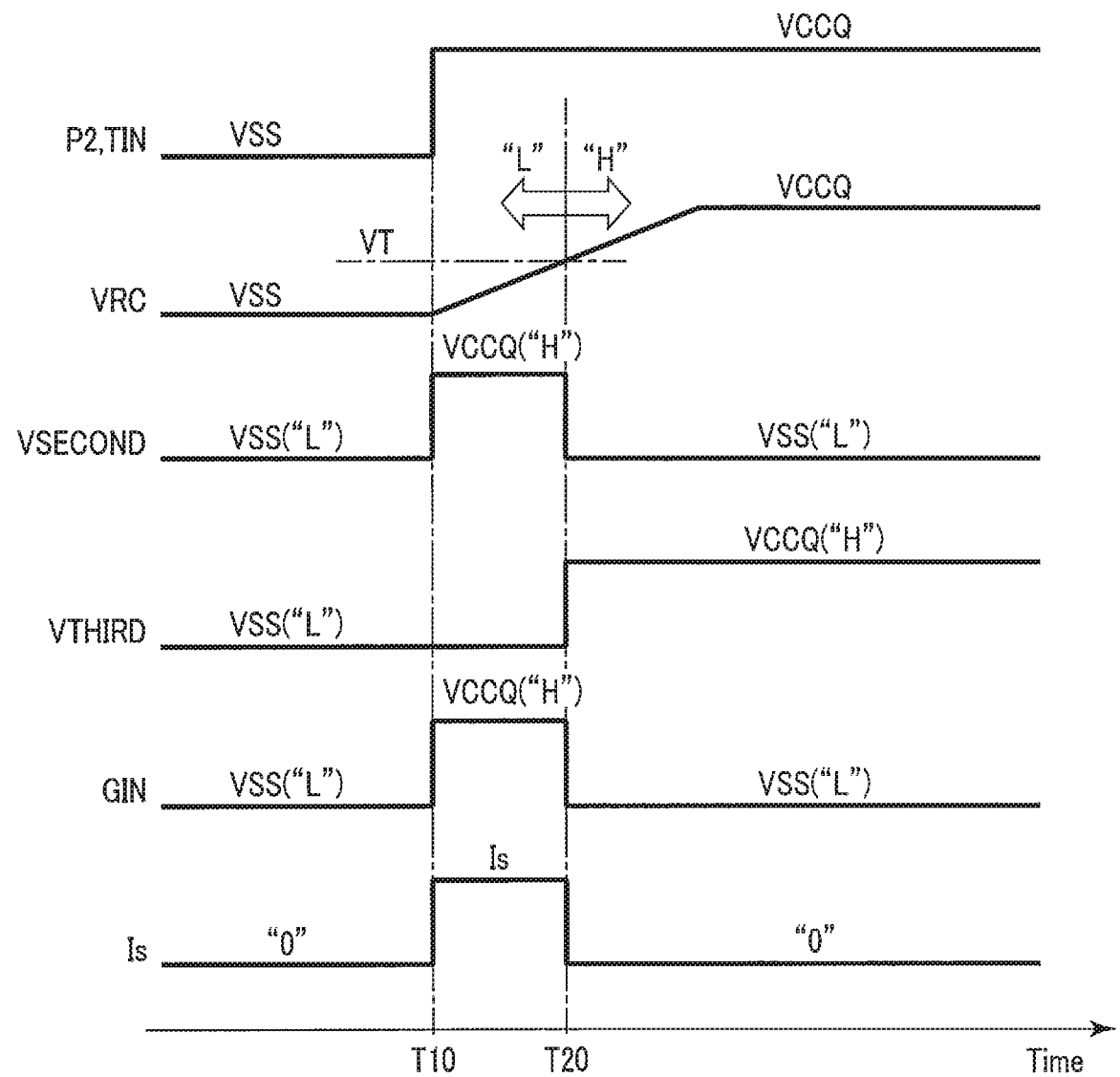
FIG. 20 is a timing chart for describing the operation of the power supply protection circuit of the semiconductor storage device according to the third embodiment.
Figure 21:
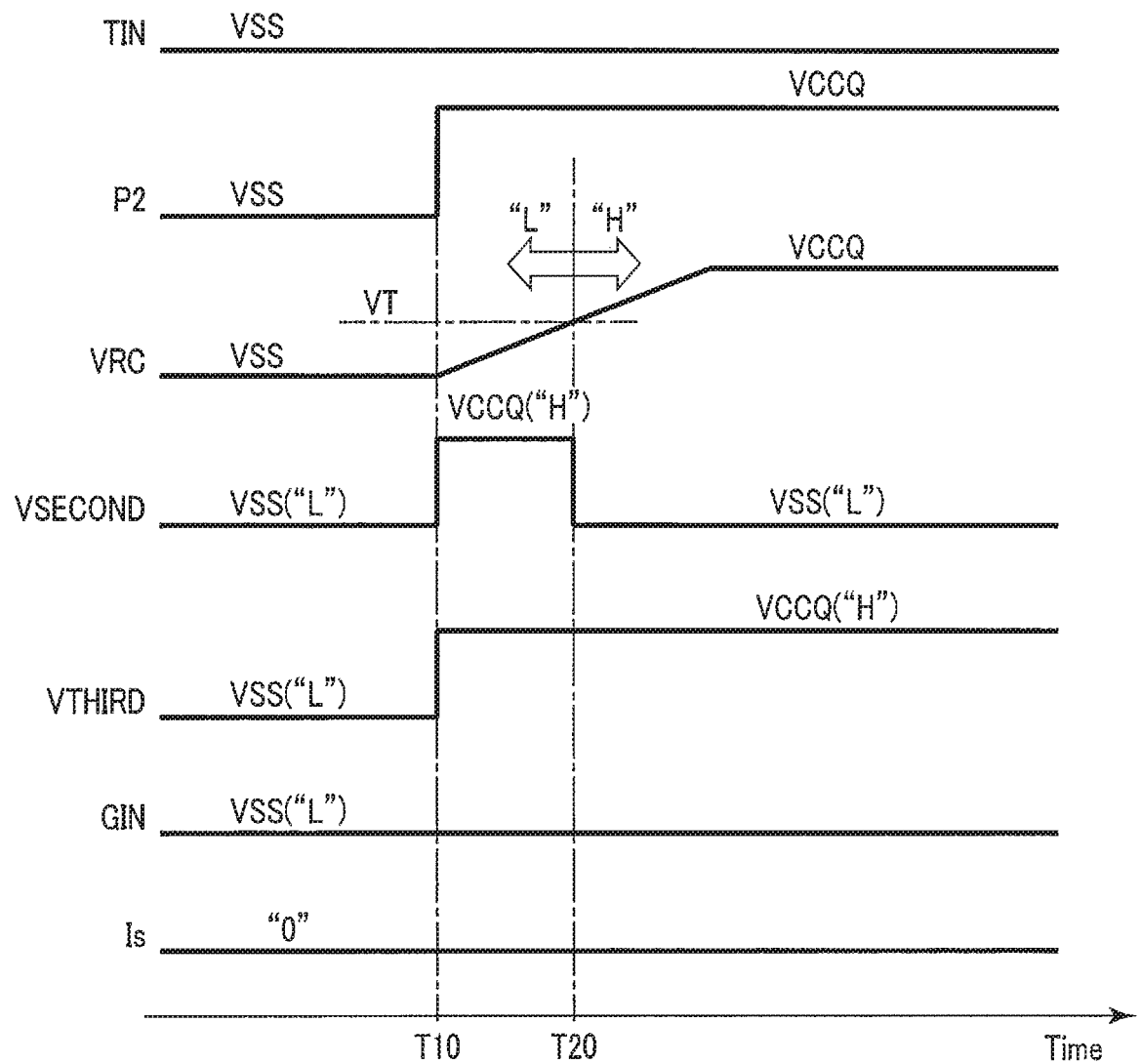
FIG. 21 is a timing chart for describing the operation of the power supply protection circuit of the semiconductor storage device according to the third embodiment.

Next, referring to FIG. 20 and FIG. 21, a description will be given of the operation of the power supply protection circuit of the semiconductor storage device according to the third embodiment. FIG. 20 and FIG. 21 correspond to FIG. 6 and FIG. 7 in the first embodiment, respectively. Specifically, FIG. 20 and FIG. 21 illustrate, respectively, the operation of the power supply protection circuit 23 of each of the chip 0 and chip 4 at the time of power-on, and the operation of the power supply protection circuit 23 of each of the chip 1 to chip 3 and the chip 5 to chip 7 at the time of power-on. Since the operations in FIG. 20 and FIG. 21 are similar to those in FIG. 6 and FIG. 7, except for the operation relating to the node TIN, an overlapping description will be omitted.

As illustrated in FIG. 20, at time instant T10, the voltages VCCQ and VSS are supplied to the chip 0 and chip 4, and the transistor Tr13 enters the ON state. In addition, since the negative OR circuit NOR outputs the voltage VCCQ to the node TIN, the capacitor C3 is charged. Besides, the transistor Tr9 enters the OFF state, and the node VTHIRD is disconnected from the pad P2.

On the other hand, as illustrated in FIG. 21, in the chip 1 to chip 3 and the chip 5 to chip 7, the operation up to time instant T10 is the same as in the chip 0 and chip 4.

At time instant T10, the voltage VCCQ and VSS are supplied to the semiconductor storage device 20. In accordance with this, the transistor Tr13 enters the ON state. However, since the negative OR circuit NOR outputs the voltage VSS to the node TIN, the voltage VSS is supplied to the gate of the transistor Tr9. The transistor Tr9 enters the ON state, and the node VTHIRD is connected to the pad P2. Accordingly, the capacitor C2 is charged.

Thus, after time instant T10, the nodes VTHIRD and GIN have "H" level and "L" level, respectively, regardless of the level of the node VSECOND. Accordingly, the current Is does not flow in the chip 1 to chip 3 and the chip 5 to chip 7.

By the above, the operation of the power supply protection circuit is completed.

3.4 Advantageous Effects of the Present Embodiment

According to the third embodiment, the voltage VCCQ is not supplied to the pads P4 and P5 of the chip 0 and chip 4. On the other hand, the voltage VCCQ is supplied to any one of the pads P4 and P5 of the chip 1 to chip 3 and the chip 5 to chip 7. Each of the power supply protection circuits 23 of the chip 0 to chip 7 has the configuration of the RCTMOS circuit, and also includes the transistor Tr9 and negative OR circuit NOR. The negative OR circuit NOR includes the first input terminal connected to the pad P4, the second input terminal connected to the pad P5, and the output terminal connected to the gate of the transistor Tr9. Transistor Tr9 includes the first end connected to the pad P2, and the second end connected to the node VTHIRD. Thereby, when the voltage VCCQ is supplied to the semiconductor storage device 20, the transistor Tr9 enters the OFF state in the chip 0 and chip 4, and the transistor Tr9 enters the ON state in the chip 1 to chip 3 and the chip 5 to chip 7. Thus, the current Is can be prevented from flowing in the power supply protection circuits 23 of the chip 1 to chip 3 and the chip 5 to chip 7, by using the existing pads P4 and P5, without providing new pads P1. Accordingly, the circuit area corresponding to the pads P1 can further be reduced.

Additionally, according to the third embodiment, the same advantageous effects as in the first embodiment and other modes can be obtained.

In the third embodiment, the case has been described in which the four chips are identified in accordance with the patterns of voltages which are supplied to the two pads P4 and P5. However, the number of chips to be identified is not limited to four. For example, when the number of chips in one channel is eight, the eight chips can individually be identified in accordance with the patterns of voltages which are supplied to three pads for chip identification. In addition, by properly providing a logic circuit corresponding to the patterns of voltages, only the power supply protection circuit 23 of the lowermost chip can normally be operated, and the operations of the power supply protection circuits 23 of the other chips can be stopped.

3.5 Modification of the Third Embodiment

The semiconductor storage device according to the third embodiment is not limited to the above example, and various modifications are applicable.

For example, as illustrated in FIG. 22, the power supply protection circuit 23 may be configured to further include a transistor Tr14. The transistor Tr14 includes a first end connected to the pad P2, a second end connected to the node VRC, and a gate connected to the node TIN. The transistor Tr14 is always in the OFF state in the chip 0 and chip 4, and is always in the ON state in the chip 1 to chip 3 and the chip 5 to chip 7.

Thereby, the transistor Tr14 does not affect the operation of the RCTMOS circuit in the chip 0 and chip 4. On the other hand, in the chip 1 to chip 3 and the chip 5 to chip 7, the voltage of the node VRC can be set at the "H" level at the same time as the voltage VCCQ is supplied to the pad P2. Thus, the voltage of the node VTHIRD can stably be set at the "H" level, and, by extension, the transistor Tr12 can stably be set in the OFF state.

4. Fourth Embodiment

Next, a semiconductor storage device according to a fourth embodiment will be described. As regards the semiconductor storage devices according to the first embodiment to third embodiment, the example was described in which the respective chips in the semiconductor storage device are connected to the package substrate by bonding wires. Regarding the semiconductor storage device according to the fourth embodiment, an example will be described in which the respective chips in the semiconductor storage device are connected to the package substrate by a TSV (Through Silicon Via) method. In the semiconductor storage device according to the fourth embodiment, for example, the power supply protection circuit is not included in a core chip, but is included only in an interface chip.

Referring to FIG. 23, a cross-sectional configuration of the semiconductor storage device according to the fourth embodiment will be described. As illustrated in FIG. 23, bumps 41 are provided on a lower surface of a package substrate (semiconductor substrate) 40. The package substrate 40 is electrically connected to the outside of a semiconductor storage device 20A via the bumps 41.

An interface chip (semiconductor chip) 42 is provided on an upper surface of the package substrate 40.

A plurality of core chips (core chip 0 to core chip 7) 43 are provided above the upper surfaces of the interface chip 42 and package substrate 40. A core chip m (1≤m≤7) is provided above a core chip (m−1). Through-silicon vias (TSVs) 44 are provided through each of the core chip 0 to core chip 6 excluding the uppermost core chip 7. The through-silicon vias 44 extend from the upper surface to lower surface of each of the core chip 0 to core chip 6. In addition, bumps 45 are provided between the TSVs 44.

An interconnect layer (RDL: Re-Distribution Layer) 46 is provided on a lower surface of the lowermost core chip 0. Bumps 47 are provided between the interconnect layer 46 and the interface chip 42. On the other hand, bumps 48 are provided between the interconnect layer 46 and the package substrate 40. The distance between the interconnect layer 46 and interface chip 42 is less than the distance between the interconnect layer 46 and package substrate 40. Accordingly, the size of the bump 47 is less than the size of the bump 48.

Referring to FIG. 24 and FIG. 25, a description will be given of a configuration including the power supply protection circuit in the semiconductor storage device according to the fourth embodiment which is constructed as described above.

As illustrated in FIG. 24, each of the core chips 43 includes, for example, an inverter NV3, a transistor Tr15, a resistor R3, and a pad P4. In addition, the interface chip 42 includes a power supply protection circuit 23A, a pad P2, and a pad P3. The through-silicon vias 44, bumps 45 and 47, and interconnect layer 46 include a resistor R4.

The pad P4 is supplied with a voltage VCC or VPP from the outside of the semiconductor storage device 20A, for example, via the bumps 41. The voltages VCC and VPP are power supply voltages which are supplied from the outside, and the voltages VCC and VPP are, for example, 1.8 V and 12 V, respectively. The inverter NV3 includes an input terminal connected to the pad 4, and an output terminal connected to an internal circuit (not shown) of the core chip 43. The resistor R3 includes a first end connected to the gate of the transistor Tr15, and a second end connected to a first end of the resistor R4. The transistor Tr15 includes a first end to which the voltage VPP is supplied, a second end connected to the resistor R4, and the gate. The resistor R4 includes the first end, and a second end connected to the pad P3. The power supply protection circuit 23A is connected to the pads P2 and P3. The pads P2 and P3 are supplied with the voltages VCCQ and VSS, respectively.

As illustrated in FIG. 25, the power supply protection circuit 23A includes transistors Tr1 to Tr12, resistors R1 and R2, and capacitors C1 and C2. The respective structural components of the power supply protection circuit 23A, and the functions, which these structural components have, are the same as those of the power supply protection circuits 23 described in the first embodiment to third embodiment. Thus, a description thereof is omitted.

By the above-described configuration, when a surge occurs in the voltage VCC or VPP which is supplied to the core chip 43, the surge is input to the power supply protection circuit 23A in the interface chip 42 via the through-silicon vias 44, bumps 45, interconnect layer 46, and bumps 47. The power supply protection circuit 23A detects the surge, with reference to the voltage VCCQ which is supplied from the pad P2, and passes a through-current Is. The through-current Is flows from the pad P2 toward the pad P4. Thereby, the effect of the surge is mitigated in the voltage VCC or VPP which is supplied to the internal circuit in the core chip 43.

According to the fourth embodiment, the interface chip 42 and the plural core chips 43 are stacked on the package substrate 40 by the TSV method. In addition, the interface chip 42 includes the power supply protection circuit 23A. The power supply protection circuit 23A is connected to the pad P4 in the core chip 43 via the bumps 47, interconnect layer 46, bumps 45, and through-silicon vias 44. Thereby, when a surge occurs in the voltage which is supplied to the pad P4, the current Is is caused to flow, and thus the internal circuit in the core chip 43 can be protected. Therefore, the internal circuit in each of the core chips 43 is protected, without the need to incorporate the power supply protection circuit 23 or 23A in each of the core chips 43. Accordingly, the circuitry scale in the core chip 43 can be reduced.

5. Others

In addition, the following matters are applicable in each of the embodiments and modifications.

In a multi-level read operation (read), a voltage applied to a word line selected in a read operation of A-level is, for example, 0 V to 0.55 V. The voltage is not limited to this, and may be 0.1 V to 0.24 V, 0.21 V to 0.31 V, 0.31 V to 0.4 V, 0.4 V to 0.5 V, or 0.5 V to 0.55 V.

A voltage applied to a word line selected in a read operation of B-level is, for example, 1.5 V to 2.3 V. The voltage is not limited to this, and may be 1.75 V to 1.8 V, 1.8 V to 1.95 V, 1.95 V to 2.1 V, or 2.1 V to 2.3 V.

A voltage applied to a word line selected in a read operation of C-level is, for example, 3.0 V to 4.0 V. The voltage is not limited to this, and may be 3.0 V to 3.2 V, 3.2 V to 3.4 V, 3.4 V to 3.5 V, 3.5 V to 3.7 V, or 3.7 V to 4.0 V.

The time (tR) of the read operation can be, for example, 25 µs to 38 µs, 38 µs to 70 µs, or 70 µs to 80 µs.

A write operation includes a program operation and a verify operation. In the write operation, a voltage first applied to a selected word line at the time of the program operation is, for example, 13.7 V to 14.3 V. The voltage is not limited to this, and may be, for example, 13.7 V to 14.0 V, or 14.0 V to 14.7 V.

A voltage first applied to a selected word line when writing to an odd-numbered word line and a voltage first applied to a selected word line when writing to an even-numbered word line may be different.

When the program operation is performed by the ISPP (Incremental Step Pulse Program) method, a step-up voltage is, for example, about 0.5 V.

The voltage applied to an unselected word line may be, for example, 7.0 V to 7.3 V. The voltage is not limited to this, and may be, for example, 7.3 V to 8.4 V, or 7.0 V or less.

The pass voltage to be applied may be changed depending on whether the unselected word line is an odd-numbered word line or an even-numbered word line.

The time (tProg) of the write operation can be, for example, 1,700 µs to 1,800 µs, 1,800 µs to 1,900 µs, or 1,900 µs to 2,000 µs.

In an erase operation, a voltage first applied to a well formed in the upper portion of the semiconductor substrate and having a memory cell arranged above is, for example, 12 V to 13.7 V. The voltage is not limited to this, and may be, for example, 13.7 V to 14.8 V, 14.8 V to 19.0 V, 19.0 V to 19.8 V, 19.8 V to 21 V.

The time (tErase) of the erase operation can be, for example, 3,000 µs to 4,000 µs, 4,000 µs to 5,000 µs, or 4,000 µs to 9,000 µs.

A memory cell includes a charge accumulation layer arranged on a 4 to 10 nm thick tunnel insulating film on the semiconductor substrate (silicon substrate). The charge accumulation layer can have a stacked structure including a 2 to 3 nm thick insulating film made of SiN, SiON, or the like and a 3 to 8 nm thick polysilicon film. A metal such as Ru may be added to polysilicon. An insulating film is formed on the charge accumulation layer. This insulating film includes, for example, a 4 to 10 nm thick silicon oxide film sandwiched between a 3 to 10 nm thick lower high-k film and a 3 to 10 nm thick upper high-k film. The high-k films are made of, for example, HfO. The silicon oxide film can be thicker than the high-k films. A 30 to 70 nm thick control electrode is formed on a 3 to 10 nm thick material to adjust the work function of the insulating film. The material for work function adjustment is a metal oxide film such as TaO or a metal nitride film such as TaN. W or the like can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A semiconductor storage device comprising a first chip including a power supply protection circuit,
the power supply protection circuit including:
a first pad;
a second pad to which a first voltage is supplied;
a third pad to which a second voltage lower than the first voltage is supplied;
a resistor including a first end electrically connected to the second pad;
a first capacitor including a first end electrically connected to a second end of the resistor;
a first transistor including a first end electrically connected to the second pad, a second end electrically connected to a node with a signal of a value based on a voltage of the first end of the first capacitor, and a gate electrically connected to the first pad;
a first inverter including an input terminal electrically connected to the second end of the first transistor; and
a second transistor electrically connected between the second pad and the third pad, the second transistor including a gate electrically connected to an output terminal of the first inverter.

2. The device of claim 1, wherein the power supply protection circuit further includes:
a third transistor including a first end electrically connected to the first pad, a second end electrically connected to the third pad, and a gate electrically connected to the second pad; and
a second capacitor including a first end electrically connected to the first pad, and a second end electrically connected to the third pad.

3. The device of claim 2, wherein the power supply protection circuit further includes:
a fourth transistor including a first end electrically connected to the second pad, a second end electrically connected to the first end of the first capacitor, and a gate electrically connected to the first pad.

4. The device of claim 2, wherein the first chip includes a plurality of power supply protection circuits including the power supply protection circuit, and
each of the plurality of power supply protection circuits is configured to share the third transistor and the second capacitor.

5. The device of claim 2, further comprising a second chip including the power supply protection circuit,
wherein the first voltage is supplied to the first pad of the first chip, and
the first pad of the second chip is electrically disconnected from the first pad of the first chip.

6. The device of claim 5, wherein the first chip and the second chip are provided above a substrate, and
the second chip is provided above the first chip.

7. The device of claim 2, wherein the power supply protection circuit further includes:
a second inverter including an input terminal electrically connected to the first pad, and an output terminal electrically connected to the gate of the first transistor.

8. The device of claim 7, wherein the power supply protection circuit further includes:
a third inverter including an input terminal electrically connected to the first pad; and
a fourth transistor including a first end electrically connected to the second pad, a second end electrically connected to the first end of the first capacitor, and a gate electrically connected to an output terminal of the third inverter.

9. The device of claim 8, further comprising a second chip including the power supply protection circuit,
wherein the first pad of the first chip is electrically disconnected from the first pad of the second chip, and
the first voltage is supplied to the first pad of the second chip.

10. The device of claim 9, wherein the first chip and the second chip are provided above a substrate, and
the second chip is provided above the first chip.

11. A semiconductor storage device comprising a first chip including a power supply protection circuit,
the power supply protection circuit including:
a first pad;
a second pad;
a logical circuit including a first input terminal electrically connected to the first pad, and a second input terminal electrically connected to the second pad;
a third pad to which a first voltage is supplied;
a fourth pad to which a second voltage lower than the first voltage is supplied;
a resistor including a first end electrically connected to the third pad;
a first capacitor including a first end electrically connected to a second end of the resistor;
a first transistor including a first end electrically connected to the third pad, a second end electrically connected to a node with a signal of a value based on a voltage of the first end of the first capacitor, and a gate electrically connected to an output terminal of the logical circuit;
a first inverter including an input terminal electrically connected to the second end of the first transistor; and
a second transistor electrically connected between the third pad and the fourth pad, the second transistor including a gate electrically connected to an output terminal of the first inverter.

12. The device of claim 11, wherein the logical circuit includes a negative OR circuit.

13. The device of claim 12, further comprising a second chip including the power supply protection circuit,
wherein the first voltage is supplied to one of the first pad of the second chip and the second pad of the second chip, and
the first pad of the first chip and the second pad of the first chip are electrically disconnected from the first pad of the second chip and the second pad of the second chip.

14. The device of claim 13, wherein the first chip and the second chip are provided above a substrate, and
the second chip is provided above the first chip.

15. The device of claim 11, wherein the power supply protection circuit further includes:
a third transistor including a first end electrically connected to the output terminal of the logical circuit, a second end electrically connected to the fourth pad, and a gate electrically connected to the third pad; and
a second capacitor including a first end electrically connected to the output terminal of the logical circuit, and a second end electrically connected to the fourth pad.

16. The device of claim 15, wherein the power supply protection circuit further includes:
a fourth transistor including a first end electrically connected to the third pad, a second end electrically connected to the first end of the first capacitor, and a gate electrically connected to the output terminal of the logical circuit.

17. The device of claim 15, wherein the first chip includes a plurality of power supply protection circuits including the power supply protection circuit, and each of the plurality of power supply protection circuits is configured to share the third transistor and the second capacitor.

* * * * *